United States Patent
Bash et al.

(10) Patent No.: US 7,313,924 B2
(45) Date of Patent: Jan. 1, 2008

(54) CORRELATION OF VENT TILES AND RACKS

(75) Inventors: Cullen E. Bash, San Francisco, CA (US); Chandrakant D. Patel, Fremont, CA (US); Ratnesh K. Sharma, Union City, CA (US); Abdlmonem Beitelmal, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 494 days.

(21) Appl. No.: 10/960,573

(22) Filed: Oct. 8, 2004

(65) Prior Publication Data

US 2006/0075764 A1 Apr. 13, 2006

(51) Int. Cl.
*F25D 17/00* (2006.01)
*F25D 23/12* (2006.01)
*H05K 7/20* (2006.01)

(52) U.S. Cl. ............. 62/178; 62/259.2; 361/692; 361/695; 700/276

(58) Field of Classification Search ............ 62/178, 62/180, 186, 259.2; 361/687, 690, 692, 694, 361/695, 696; 700/276; 236/49.3; 454/184
See application file for complete search history.

(56) References Cited

U.S. PATENT DOCUMENTS

| | | | |
|---|---|---|---|
| 6,374,627 B1* | 4/2002 | Schumacher et al. ...... 62/259.2 |
| 6,574,104 B2* | 6/2003 | Patel et al. .................. 361/695 |
| 6,868,682 B2* | 3/2005 | Sharma et al. ................ 62/180 |
| 6,925,828 B1* | 8/2005 | Gerstner et al. ........... 62/259.2 |
| 7,013,968 B2* | 3/2006 | Beitelmal et al. ........... 165/244 |
| 2005/0182523 A1* | 8/2005 | Nair ........................... 700/276 |
| 2006/0075764 A1* | 4/2006 | Bash et al. .................... 62/178 |
| 2006/0080001 A1* | 4/2006 | Bash et al. ................. 700/276 |
| 2006/0091229 A1* | 5/2006 | Bash et al. ................. 236/49.3 |
| 2007/0078635 A1* | 4/2007 | Rasmussen et al. ........... 703/1 |

OTHER PUBLICATIONS

Computer Dictionary definition of "module", Microsoft Press, 1997, p. 313.*

* cited by examiner

*Primary Examiner*—Marc Norman

(57) ABSTRACT

In a method for correlating vent tiles with racks, the vent tiles are opened to a first setting and the mass flow rates of air received by the racks and supplied through the vent tiles are determined. In addition, one of the vent tiles is closed to obtain a second setting and the mass flow rates of air received by the racks and supplied through the vent tiles are determined at the second setting. The vent tiles and the racks are correlated based upon the determined mass flow rates of air received by the racks and the mass flow rates of air supplied through the vent tiles at the first and second settings.

31 Claims, 10 Drawing Sheets

CORRELATION OF VENT TILES AND RACKS

CROSS-REFERENCE TO RELATED APPLICATION

This application is related to commonly assigned and U.S. patent application Ser. No. 10/960,574, entitled "Correlation of Vent Tile Settings and Rack Temperatures", filed on even date herewith, the disclosure of which is hereby incorporated by reference in its entirety.

BACKGROUND

A data center may be defined as a location, for instance, a room that houses computer systems arranged in a number of racks. A standard rack, for instance, an electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, about forty (40) systems, with future configurations of racks being designed to accommodate 200 or more systems. The computer systems typically dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

Data centers are typically equipped with a raised floor with vent tiles configured to provide cool air to the computer systems from a pressurized plenum in the space below the raised floor. In certain instances, these vent tiles contain manually adjustable dampers for varying the flow rate of cool air therethrough. However, because these vent tiles cannot be remotely controlled, they are typically unable to vary the airflow to dynamically provision the data center with cooling resources. In addition, these vent tiles are typically manually actuated without knowledge of how each vent tile affects computer systems in its proximity. These actuations frequently have unintended consequences, such as, inadequate airflow delivery to the racks, adverse recirculation of heated and cooled airflows, and wasted energy consumption. This may lead to inefficiencies in both cooling of the computer systems as well as in the operations of air conditioning units.

In other instances, automated vent tiles have been used in data centers to generally enable remote actuation of the vent tiles via feedback control algorithms. Conventional automated vent tiles are typically operated, however, without substantially accurate knowledge of how actuations of these vent tiles affect airflow in the data center. A process for associating vent tiles with racks would therefore be desirable.

SUMMARY OF THE INVENTION

According to an embodiment, the present invention pertains to a method for correlating vent tiles with racks. In the method, the vent tiles are opened to a first setting and the mass flow rates of air received by the racks and supplied through the vent tiles are determined. In addition, one of the vent tiles is closed to obtain a second setting and the mass flow rates of air received by the racks and supplied through the vent tiles are determined at the second setting. The vent tiles and the racks are correlated based upon the determined mass flow rates of air received by the racks and the mass flow rates of air supplied through the vent tiles at the first and second settings.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1A:
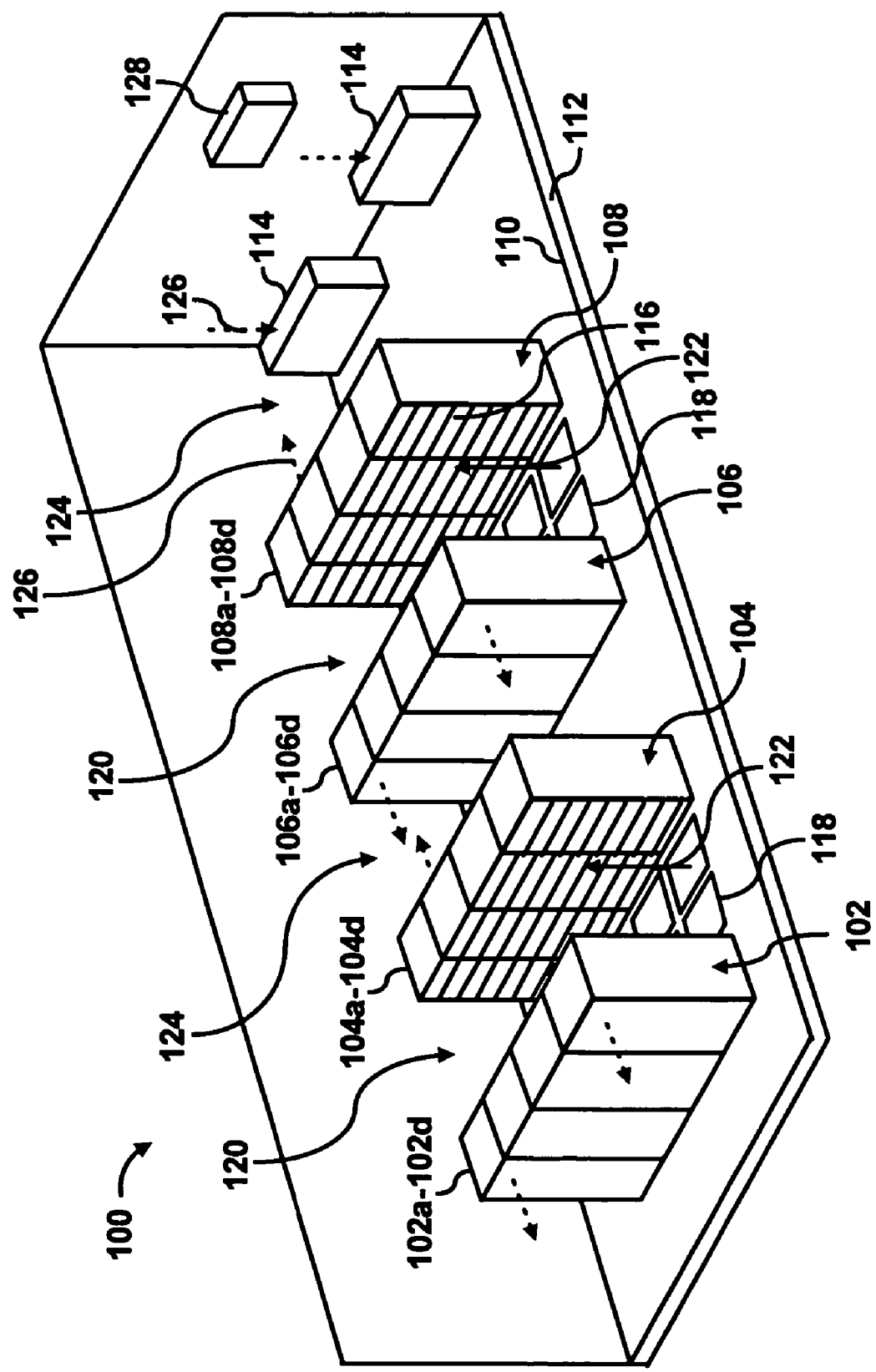
FIG. 1A shows a simplified perspective view of a data center according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

According to various examples, vent tiles in a data center are commissioned to enable determinations of their relationships with various racks of equipment housed in the data center. More particularly, procedures and algorithms are described herein for evaluating the relationships between the vent tiles and the racks. These relationships may be described by a coefficient which relates the mass flow rate of cool air delivered to the racks to the air flow rates through individual vent tiles. In certain instances, the coefficient may also relate to the temperatures of the airflow delivered to the racks through the vent tiles in addition to the mass flow rates of airflow. In other instances, the effects of airflow recirculation may also be included in the determination of the coefficient. This coefficient has been termed the "Vent Tile Influence coefficient" or VTI, for simplicity of description purposes.

The VTI may be employed for the development of vent tile control algorithms configured to, for instance, enable relatively efficient and dynamic provisioning of cooling resources in the data center. In addition, establishment of the relationships between the vent tiles and the racks may enable the creation of the vent tile control algorithms. In order to maintain certain levels of efficiency, the vent tile control algorithms, in general, are required to compensate for the variations of the relationships between vent tiles and racks. The relationships may vary due to, for instance, movement, changing, or manipulation of the equipment, changes in airflow patterns, pressure distributions, etc. In addition, the relationships may vary as computer room air condition (CRAC) unit flow rates change relative to each other in a multi-CRAC unit data center, obstructions are added or removed from within the floor plenum, the pressure distribution within the floor plenum changes, etc. In this regard, the VTI disclosed herein may compensate for the varying relationships such that the vent tile control algorithms may also adapt as the data center environment changes.

Through a determination of VTI, the relationships between various racks and vent tiles may be established. Thus, for instance, the correlation between particular racks and vent tiles may be used to determine how airflow through one or more vent tiles should be varied to obtain desired airflow characteristics through the particular racks. In this regard, vent tile control algorithms may use these relationships in controlling vent tiles to achieve desired cooling results in the data center.

Although particular reference is made throughout the present disclosure to air conditioning units and vent tiles in data centers for cooling racks, it should be understood that certain principles presented herein may be applied to cooling systems in other types of buildings. For instance, correlations between ceiling mounted air supply vent tiles and various areas of a room containing a sensor network may be made using VTI. In this example, VTI may be used to develop control algorithms that operate the air supply vent tiles to ensure that the various areas of the room receive desired levels of airflow. Thus, the descriptions presented herein with respect to VTI should not be construed as being limited solely to data centers, but that the data center environment is an example of a suitable application of the principles presented herein.

With reference first to FIG. 1A, there is shown a simplified perspective view of a data center 100 which may employ various examples of the invention. The terms "data center" are generally meant to denote a room or other space where one or more components capable of generating heat may be situated. In this respect, the terms "data center" are not meant to limit the invention to any specific type of room where data is communicated or processed, nor should it be construed that use of the terms "data center" limits the invention in any respect other than its definition herein above.

It should be readily apparent that the data center 100 depicted in FIG. 1A represents a generalized illustration and that other components may be added or existing components may be removed or modified without departing from the scope of the invention. For example, the data center 100 may include any number of racks and various other components. In addition, it should also be understood that heat generating/dissipating components may be located in the data center 100 without being housed in racks.

The data center 100 is depicted as having a plurality of racks 102-108, for instance, electronics cabinets, aligned in parallel rows. Each of the rows of racks 102-108 is shown as containing four racks (a-d) positioned on a raised floor 110. A plurality of wires and communication lines (not shown) may be located in a space 112 beneath the raised floor 110. The space 112 may also function as a plenum for delivery of cooled air from one or more computer room air conditioning (CRAC) units 114 to the racks 102-108. The cooled air may be delivered from the space 112 to the racks 102-108 through vent tiles 118 located between some or all of the racks 102-108. The vent tiles 118 are shown as being located between racks 102 and 104 and 106 and 108.

As previously described, the CRAC units 114 generally operate to supply cooled air into the space 112. The cooled air contained in the space 112 may include cooled air supplied by one or more CRAC units 114. Thus, characteristics of the cooled air, such as, temperature, pressure, flow rate, etc., may substantially be affected by one or more of the CRAC units 114. By way of example, the cooled air supplied by one CRAC unit 114 may mix with cooled air supplied by another CRAC unit 114. In this regard, characteristics of the cooled air at various areas in the space 112 and the cooled air supplied to the racks 102-108 may vary, for instance, if the temperatures or the volume flow rates of the cooled air supplied by these CRAC units 114 differ due to mixing of the cooled air. In certain instances, the level of influence of a CRAC unit 114 over the racks 102-108 may be higher for those racks 102-108 that are in closer proximity to the CRAC unit 114. In addition, the level of influence of a CRAC unit 114 over the racks 102-108 may be lower for those racks 102-108 that are located farther away from the CRAC unit 114.

Moreover, a particular vent tile 118 may have greater levels of influence over particular racks 102-108 and have lesser levels of influence over other racks 102-108. The level of influence the vent tiles 118 have over various racks 102-108 is considered herein as a vent tile influence coefficient (VTI) and is described in greater detail herein below. In one respect, the VTI may be employed in vent tile control algorithms to relatively accurately control the level of cooled airflow delivered to the various racks 102-108.

The vent tiles 118 may comprise manually or remotely adjustable vent tiles. In this regard, the vent tiles 118 may be manipulated to vary, for instance, the mass flow rates of cooled air supplied to the racks 102-108. In addition, the vent tiles 118 may comprise the dynamically controllable vent tiles disclosed and described in commonly assigned U.S. Pat. No. 6,574,104, the disclosure of which is hereby incorporated by reference in its entirety. As described in the U.S. Pat. No. 6,574,104 patent, the vent tiles 118 are termed "dynamically controllable" because they generally operate to control at least one of velocity, volume flow rate and direction of the cooled airflow therethrough. In addition, specific examples of dynamically controllable vent tiles 118 may be found in U.S. Pat. No. 6,694,759, filed on Jan. 27, 2003, which is assigned to the assignee of the present invention and is incorporated by reference herein in its entirety.

The racks 102-108 are generally configured to house a plurality of components 116 capable of generating/dissipating heat (not shown), for instance, processors, micro-controllers, high-speed video cards, memories, semi-conductor devices, and the like. The components 116 may be elements of a plurality of subsystems (not shown), for instance, computers, servers, bladed servers, etc. The subsystems and the components may be operated to perform various electronic functions, for instance, computing, switching, routing, displaying, and the like. In the performance of these electronic functions, the components, and therefore the subsystems, may generally dissipate relatively large amounts of heat. Because the racks 102-108 have generally been known to include upwards of forty (40) or more subsystems, they may transfer substantially large amounts of heat to the cooled air flowing therethrough to maintain the subsystems and the components generally within predetermined operating temperature ranges.

The areas between the racks 102 and 104 and between the racks 106 and 108 may comprise cool aisles 120. These aisles are considered "cool aisles" because they are configured to receive cooled airflow from the vent tiles 118, as generally indicated by the arrows 122. In addition, the racks 102-108 generally receive cooled air from the cool aisles 120. The aisles between the racks 104 and 106, and on the rear sides of racks 102 and 108, are considered hot aisles 124. These aisles are considered "hot aisles" because they are positioned to receive air that has been heated by the components 116 in the racks 102-108, as indicated by the arrows 126. By substantially separating the cool aisles 120 and the hot aisles 124, for instance, with the racks 102-108, the heated air may substantially be prevented from re-circulating with the cooled air prior to delivery into the racks 102-108. In addition, the cooled air may also substantially be prevented from re-circulating with the heated air prior to returning to the CRAC units 114. However, there may be areas in the data center 100 where re-circulation of the cooled air and the heated air occurs. By way of example, cooled air may mix with heated air around the sides or over the tops of one or more of the racks 102-108.

The sides of the racks 102-108 that face the cool aisles 120 may be considered as the fronts of the racks and the sides of the racks 102-108 that face away from the cool aisles 120 may be considered as the rears of the racks 102-108. For purposes of simplicity and not of limitation, this nomenclature will be relied upon throughout the present disclosure to describe the various sides of the racks 102-108.

According to another example, the racks 102-108 may be positioned with their rear sides adjacent to one another (not shown). In this embodiment, the vent tiles 118 may be provided in each aisle 120 and 124. In addition, the racks 102-108 may comprise outlets on top panels thereof to enable heated air to flow out of the racks 102-108.

As described herein above, the CRAC units 114 generally operate to cool received heated air as indicated by the arrows 126. In addition, the CRAC units 114 may supply the racks 102-108 with airflow that has been cooled, through any reasonably suitable known manners and may thus comprise widely available, conventional CRAC units 114. For instance, the CRAC units 114 may comprise vapor-compression type air conditioning units, chiller type air conditioning units, etc. Examples of suitable CRAC units 114 may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

Also shown in FIG. 1A is a computing device 128 configured to control various operations of the data center 100. The computing device 128 may be configured, for instance, to control the vent tiles 118 to thereby vary at least one of a direction and a volume flow rate of cooled airflow delivered through the vent tiles 118. In one regard, the computing device 128 may control the vent tiles 118 to move from fully closed positions to fully open positions. In addition, the computing device 128 may be configured to determine VTI as described herein below. Although the computing device 128 is illustrated in FIG. 1A as comprising a component separate from the components 116 housed in the racks 102-108, the computing device 128 may comprise one or more of the components 116 without departing from a scope of the data center 100 disclosed herein.

The data center 100 is illustrated in FIG. 1A as containing four rows of racks 102-108 and two CRAC units 114 for purposes of simplicity and illustration. Thus, the data center 100 should not be limited in any respect based upon the number of racks 102-108 and CRAC units 114 illustrated in FIG. 1A. In addition, although the racks 102-108 have all been illustrated similarly, the racks 102-108 may comprise heterogeneous configurations. For instance, the racks 102-108 may be manufactured by different companies or the racks 102-108 may be designed to house differing types of components 116, for example, horizontally mounted servers, bladed servers, etc.

Figure 1B:
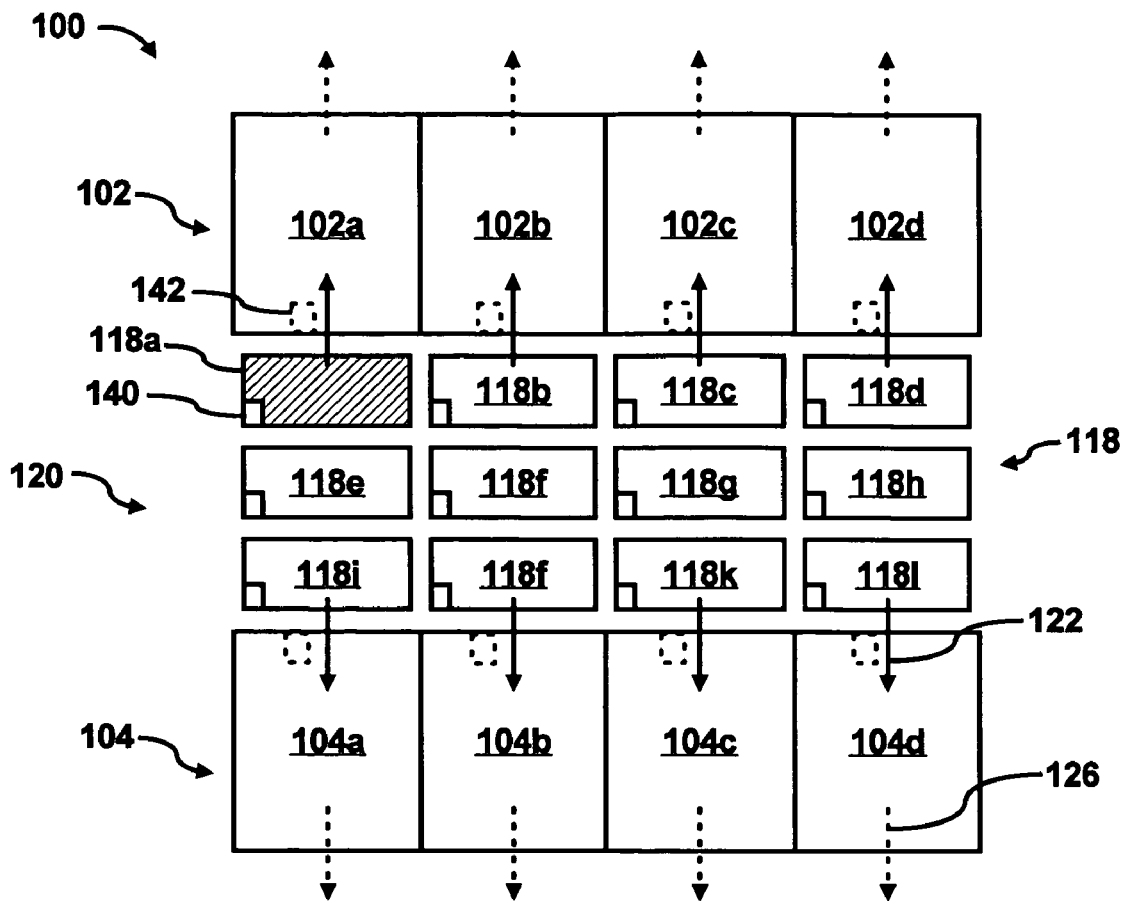
FIG. 1B illustrates a simplified plan view of a portion of the data center shown in FIG. 1A.

Various manners in which the cooled airflow is supplied by the vent tiles 118 to the racks 102-108 will be described in greater detail with respect to FIG. 1B. FIG. 1B illustrates a simplified plan view of a portion of the data center 100. More particularly, FIG. 1B illustrates the portion of the data center 100 including rows of racks 102 and 104 and a cool aisle 120. It should be understood that the description set forth herein below with respect to FIG. 1B is also applicable to the other rows of racks 106 and 108 and cool aisles 120.

The vent tiles 118 are illustrated in FIG. 1B as comprising a plurality of separately controllable vent tiles $118a$-$118l$. The number of vent tiles $118a$-$118l$ depicted in FIG. 1B are for purposes of illustration only and are thus not meant to limit the data center 100 in any respect. In addition, although the vent tiles $118a$-$118l$ are shown as being positioned with respect to respective racks $102a$-$102d$ and $104a$-$104d$, such placement of the vent tiles $118a$-$118l$ are a not to be construed as limiting the data center 100 in any respect.

As described herein above with respect to FIG. 1A, the vent tiles $118a$-$118l$ are in fluid communication with a space 112 or plenum containing pressurized cooled air supplied into the space 112 by one or more CRAC units 114. For those vent tiles $118a$-$118l$ that are open, the cooled air may be supplied into an area above the vent tiles $118a$-$118l$. The cooled air supplied into the area by the open vent tiles $118a$-$118l$ may be drawn into the racks $102a$-$102d$ and $104a$-$104d$ through openings or inlets in the racks $102a$-$102d$ and $104a$-$104d$, as indicated by the arrows 122, in a variety of different manners. For instance, the components 116 housed in the racks $102a$-$102d$ and $104a$-$104d$ may include fans (not shown) operable to draw airflow into the front sides of the racks $102a$-$102d$ and $104a$-$104d$ and to discharge air out of the rear sides of the racks $102a$-$102d$ and $104a$-$104d$. In addition or alternatively, the racks $102a$-$102d$ and $104a$-$104d$ may be equipped with one or more fans (not shown) configured to create similar airflows through the racks $102a$-$102d$ and $104a$-$104d$. The vent tiles $118a$-$118l$ may also be designed to assist the supply of airflow through the racks $102a$-$102d$ and $104a$-$104d$ through control of the direction of the airflow supplied.

As the cooled air flows through the racks $102a$-$102d$ and $104a$-$104d$ and therefore the components 116, the cooled air may become heated by absorbing heat dissipated from the components 116. The heated air may exit the racks $102a$-$102d$ and $104a$-$104d$ through one or more outlets located on the rear sides of the racks $102a$-$102d$ and $104a$-$104d$, as indicated by the arrows 126.

The vent tile $118a$ is illustrated as being in a fully closed position; whereas, the vent tiles $118b$-$118l$ are illustrated as being in fully open positions. However, the rack $102a$ may still draw cooled airflow from the area above the vent tiles 118a-118l as indicated by the arrow 122. The airflow drawn into the rack 102a may comprise airflow supplied into the area by one or more of the vent tiles 118b-118l. In addition, the airflow drawn into the rack 102a, as well as the other racks 102b-102d and 104a-104d, may also comprise airflow that has been heated, for instance, in one or more of the racks 102a-102d and 104a-104d. This airflow may be considered as re-circulated airflow since the heated airflow may have re-circulated into the cooled airflow.

The vent tiles 118a-118l may each include sensors 140 configured to detect one or more conditions of the cooled airflow supplied through the vent tiles 118a-118l. For instance, the sensors 140 may be equipped to detect the temperature of the airflow supplied through respective vent tiles 118a-118l. In this regard, the sensors 140 may include thermistors, thermocouples, or the like. As another example, the sensors 140 may be equipped to detect the mass flow rates of the airflow supplied through respective vent tiles 118a-118l. Thus, for instance, the sensors 140 may comprise anemometers or the like. Alternatively, the mass flow rates of airflow through the vent tiles 118a-118l may be estimated through a determination of, for instance, the pressure in the space 112 and the percentages that the vent tiles 118a-118l are open.

Figure 1C:
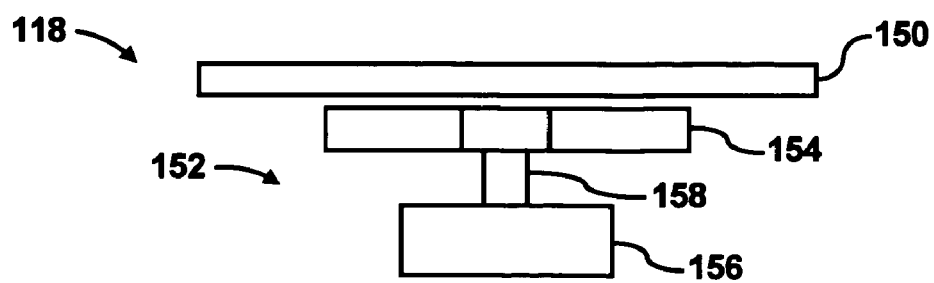
FIG. 1C illustrates a simplified side elevational view of an example of a vent tile shown in FIG. 1B.

Some or all of the vent tiles 118a-118l may also comprise fans, as shown in FIG. 1C. FIG. 1C illustrates a simplified side elevational view of a vent tile 118a-118l having a cover 150 and a fan assembly 152. The cover 150 includes a plurality of openings (not shown) to enable substantially unimpeded airflow through the cover 150. The fan assembly 152 includes a fan 154 connected to a motor 156 by a rod 158. The motor 156 may be operated at various speeds to thereby vary the speed of the fan 154 and thus the mass flow rate of air supplied through the cover 150. The vent tiles 118a-118l may be considered as being closed when the fans 154 are not rotating. In addition, the different speeds at which the fans 154 are rotated may be equivalent to the percentages that the vent tiles 118a-118l are considered open. Thus, for instance, if a vent tile 118a-118l is considered as being 90% open, an equivalent state for a vent tile 118a-118l equipped with a fan 154 is when the fan 154 is operated at 90% of its maximum rated speed. The sensors 140 may detect the speeds of the fans 154 by detecting the operations of the motors 156. For instance, the sensors 140 may comprise encoders configured to detect the speed at which the motor 156 is rotating, power meter to detect the power draw of the motor 156, and the like.

The racks 102a-102d and 104a-104d, may each also include sensors 142 configured to detect one or more conditions of the airflow drawn through the racks 102a-102d and 104a-104d. The sensors 142 may, for instance, be equipped to detect the respective temperatures of the air flowing into each of the racks 102a-102d and 104a-104d and may thus, include thermistors, thermocouples, or the like. In addition, the sensors 142 may be equipped to detect the mass flow rates of air flowing through the respective racks 102a-102d and 104a-104d and may thus include anemometers or the like. Alternatively, the mass flow rates of airflow through the racks 102a-102d and 104a-104d may be estimated through a determination of, for instance, the temperature increases from the inlets of the racks 102a-102d and 104a-104d to the outlets of the racks 102a-102d and 104a-104d along with the power drawn by the components 116 contained in the respective racks 102a-102d and 104a-104d, the speeds of various fans contained in the respective racks 102a-102d and 104a-104d, etc.

Figure 2:
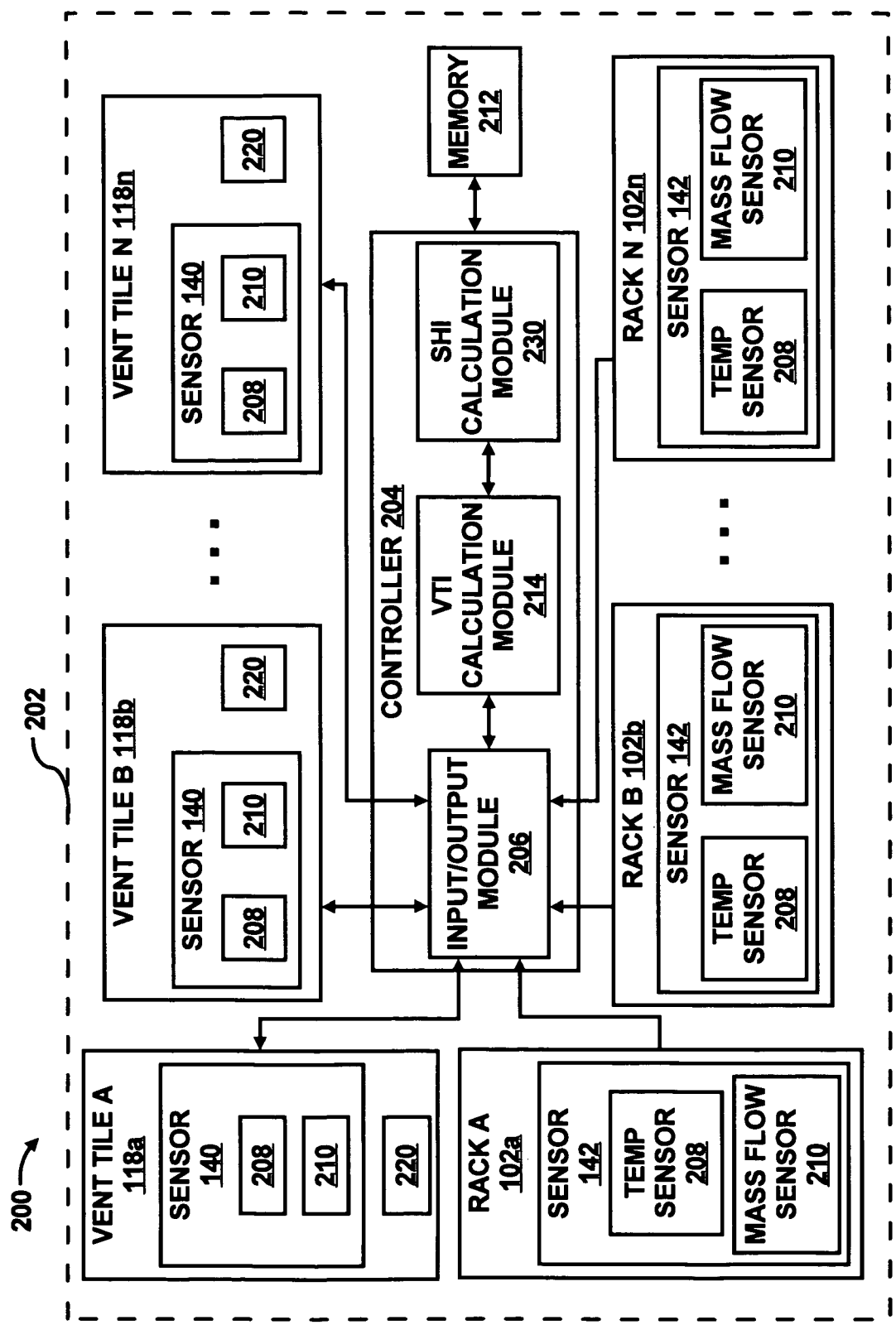
FIG. 2 is a block diagram of a vent tile influence evaluation system according to an embodiment of the invention.

FIG. 2 is a block diagram 200 of a vent tile influence evaluation system 202. It should be understood that the following description of the block diagram 200 is but one manner of a variety of different manners in which such a system 202 may be operated. In addition, it should be understood that the system 202 may include additional components and that some of the components described may be removed and/or modified without departing from a scope of the system 202.

The system 202 includes a controller 204 configured to control the operations of the system 202. The controller 204 may, for instance, comprise the computing device 128 shown in FIG. 1A. In addition or alternatively, the controller 204 may comprise a different computing device, a microprocessor, a micro-controller, an application specific integrated circuit (ASIC), and the like. In general, the controller 204 is configured to receive data from various components in the data center 100, to process the data to calculate an influence level respective vent tiles have over respective racks, and to output the influence level, as described in greater detail herein below.

The controller 204 includes an input/output module 206 configured to receive data pertaining to measured or estimated conditions detected at a variety of locations in the data center 100. The input/output module 206 may also be configured to output various commands and other data by the controller 204 as described below. As shown in FIG. 2, the input/output module 206 is configured to receive data from the sensors 140 of a plurality of vent tiles 118a-118n and from the sensors 142 of a plurality of racks 102a-102n. The data received from these sensors 140 and 142 may include, for instance, temperature information detected by temperature sensors 208 and mass flow rate information detected by mass flow rate sensors 210. As an alternative to the use of mass flow rate sensors 210, the mass flow rates of airflow through the vent tiles 118a-118n and the racks 102a-102n may be estimated by the controller 204 through various other means. For instance, the mass flow rates may be estimated through use of temperature drop detection along with power draw detection, pressure differences, fan speeds, etc. Thus, although mass flow rate sensors 210 are explicitly shown in FIG. 2, it should be understood that these sensors 210 may be omitted without departing from a scope of the system 202.

The controller 204 may receive data from the sensors 140 and 142 through any reasonably suitable means. For instance, communications between the controller 204 and the sensors 140 and 142 may be effectuated through wired connections or through wireless protocols, such as IEEE 801.11b, 801.11g, wireless serial connection, Bluetooth, etc., or combinations thereof. In one regard, the input/output module 206 may thus also function as an adapter to enable the transfer of data from the sensors 140 and 142 to the controller 204.

Although the vent tiles 118a-118n and the racks 102a-102n are illustrated as including sensors 140 and 142, respectively, alternative means for detecting the temperatures and/or the mass flow rates at these locations may be employed without departing from a scope of the system 202. For instance, the temperatures and/or the mass flow rates may be detected by hand with a handheld device and inputted into the controller 204. As another example, the temperatures and/or mass flow rates may be detected with an adequately equipped semi-autonomous mobile sensor device (not shown). More particularly, the semi-autonomous mobile sensor device may be configured to travel around the vent tiles 118a-118n and the racks 102a-102n to detect the temperatures and/or mass flow rates of air at these locations and to communicate this information to the controller 204. In this regard, the semi-autonomous mobile sensor device may function to gather environmental condition information while requiring substantially fewer sensors in the data center 100. A more detailed description of the semi-autonomous mobile sensor device and its operability may be found in co-pending and commonly assigned U.S. application Ser. No. 10/157,892, filed on May 31, 2002, the disclosure of which is hereby incorporated by reference in its entirety.

In any regard, the data received by the controller 204 via the input/output module 206 may be stored in a memory 212. The memory 212 may also generally be configured to provide storage of software that provides the functionality of the controller 204. In one regard, the memory 212 may be implemented as a combination of volatile and non-volatile memory, such as DRAM, EEPROM, flash memory, and the like.

The data stored in the memory 212 may be accessed by a vent tile influence coefficient (VTI) calculation module 214. In addition, the memory 212 may comprise software or algorithms that the VTI calculation module 214 may implement in calculating the VTI. Although the VTI calculation module 214 has been shown in FIG. 2 as forming part of the controller 204, the functionality of the VTI calculation module 214 may instead form part of the memory 212 without departing from a scope of the system 202.

In general, the VTI calculation module 214 operates to calculate the VTI for one or more racks 102a-102n. In other words, the VTI calculation module 214 is configured to determine how changes in flow rates of airflow through various vent tiles 118a-118n affect characteristics of airflow through various racks 102a-102n. Thus, for instance, the VTI may be used to determine how one or more vent tiles 118a-118n should be manipulated to vary the temperature of airflow delivered through a rack 102a-102n. Through this knowledge, the mass flow rate of airflow through a particular rack 102a-102n may substantially be controlled through a controlled variance in the airflows through one or more of the vent tiles 118a-118n.

The racks 102a-102n may comprise some or all of the racks 102-108 shown and described with respect to FIG. 1A. In addition, the vent tiles 118a-118n may comprise some or all of the vent tiles 118 shown and described in FIGS. 1A-1C. References to the racks 102a-102n and the vent tiles 118a-118n are not intended to limit the system 202 in any respect, but are made to simplify the illustration and description of these elements.

Various manners in which the VTI may be calculated by the VTI calculation module 214 will now be described in greater detail. As stated herein above, the system 202 may be employed to commission the vent tiles 118a-118n in a data center 100. With respect to the equations set forth below, prior knowledge of rack 102a-102n and vent tile 118a-118n locations may be beneficial since this may reduce the number of VTIs calculated and the unknowns in the system of equations. However, in order to obtain the most accurate correlations between the racks 102a-102n and the vent tiles 118a-118n, the VTIs may be calculated for all possible rack 102a-102n and vent tile 118a-118n combinations.

According to an example, the VTIs for some of the vent tiles 118a-118n may be determined through approximation. In this example, a model may be created a priori to determine which of the vent tiles 118a-118n most affect a particular rack 102a-102n and to determine the VTIs for vent tiles 118a-118n that have relatively less effect on the particular rack 102a-102n by approximation. The approximated VTIs for the vent tiles 118a-118n may be based, for instance, upon their distances from the particular rack 102a-102n. Thus, those vent tiles 118a-118n that are closer to the particular rack 102a-102n may have higher approximated VTIs than those vent tiles 118a-118n that are farther from the particular rack 102a-102n. In this regard, the VTIs for all of the possible rack 102a-102n and vent tile 118a-118n combinations may not need to be determined, thus reducing the amount of time required to determine all of the VTIs.

The relationship between any particular vent tile 118a-118n and any particular rack 102a-102n may be evaluated to determine how the particular vent tiles 118a-118n influence the cooled air supplied to particular racks 102a-102n. This relationship is described herein as the VTI, which, in one respect, relates the mass flow rate of air delivered to racks 102a-102n to the air flow rates through individual vent tiles 118a-118n. This relationship may be written in matrix form as follows:

$$[VTI]=[M_R]\cdot[M_{VT}]^{-1}, \qquad \text{Equation (1):}$$

where $M_R$ is the vector of mass flow rates of air delivered to each rack 102a-102n and $M_{VT}$ is the vector of mass flow rates of air through each vent tile 118a-118n, of a particular group of racks 102a-102n and vent tiles 118a-118n. In addition, units of $M_R$ and $M_{VT}$ may be in kg/s, and VTI is dimensionless.

As may be seen from Equation (1), the matrix VTI may be determined through multiplication of the matrix $M_R$ by the inverse of the matrix $M_{VT}$. In this regard, the VTI may be determined through variations in the mass flow rates of air delivered to the racks 102a-102n and the mass flow rates of air supplied through the vent tiles 118a-118n. The mass flow rates of air supplied through the vent tiles 118a-118n may be varied by varying the operating levels of the vent tiles 118a-118n. The operating levels of the vent tiles 118a-118n may include the percentages at which the vent tiles 118a-118n are open. In this regard, the vent tiles 118a-118n may include means for varying the airflow volumes through the vent tiles 118a-118n. The means for varying the airflow volumes may be manipulated by hand or they may be remotely actuated. In certain instances, for example, the vent tiles 118a-118n may include actuators 220 for controlling the means for varying the airflow volumes. In these instances, in determining the matrix VTI, the actuators 220 may be configured to vary the volume flow rates of air through particular vent tiles 118a-118n during different runs. A more detailed description of various manners in which the VTI may be determined according to various vent tile 118a-118n settings is set forth herein below.

The vent tile actuators 220 may comprise actuators configured to vary the airflows through the vent tiles 118a-118n. Examples of suitable vent tile actuators 220 and vent tiles 118a-118n configured to vary the cooling fluid flow therethrough may be found in commonly assigned U.S. Pat. No. 6,694,759, entitled "Pressure Control of Cooling Fluid Within a Plenum Using Automatically Adjustable Vents", filed on Jan. 27, 2003, the disclosure of which is hereby incorporated by reference in its entirety. A discussion of various operational modes for these types of vents is disclosed in U.S. Pat. No. 6,574,104, which is also commonly assigned and hereby incorporated by reference in its entirety. In addition, the vent tile actuators 220 may comprise the motors 156 of the fan assemblies 152 depicted in FIG. 1C. Thus, for instance, the mass flow rates of airflow supplied through the vent tiles 118a-118n may be varied through varying of the motor 156 operations.

In addition, the mass flow rate MR through each rack 102a-102n may be determined by rearranging Equation (1) as follows:

$$[M_R] = [VTI] \cdot [M_{VT}].$$  Equation (2):

As may be seen in Equation (2), if the VTI is known and a particular mass flow rate of air is desired through a particular rack 102a-102n, the VTI may be used to correlate how the settings of one or more vent tiles 118a-118n may be varied to achieve the desired mass flow rate of air through the particular rack 102a-102n.

In certain instances, the airflow supplied into the racks 102a-102n includes airflow that has not been directly supplied through one or more of the vent tiles 118a-118n. Instead, some of the airflow may include airflow that has been re-circulated into the supply airflow. This airflow may include, for instance, airflow that has been heated in one of more of the racks 102a-102n and exhausted into the data center 100. As this re-circulated airflow may affect the temperature of the airflow supplied to the racks 102a-102n, this airflow may be considered in determining VTI. In addition, the re-circulated airflow may be considered in determining the mass flow rates of airflow through the racks 102a-102n. More particularly, Equation (2) may be re-written to include the effects of re-circulation in terms of a re-circulation matrix Γ as follows:

$$[M_R] = [VTI] \cdot [M_{VT}] + [\Gamma],$$  Equation (3):

where Γ is the matrix of the re-circulation mass flow rate that infiltrates the inlets of the racks 102a-102n and its units may be in kg/s. The values that populate the matrix Γ may be determined through a calculation of the re-circulated airflow infiltration levels into the airflow supplied by the vent tiles 118a-118n into the racks 102a-102n. These re-circulation airflow infiltration levels may be characterized by an index of re-circulation. The index of re-circulation may be termed a supply heat index (SHI), which is defined according to the following equation:

Equation (4):
$$SHI = \frac{\delta Q}{Q + \delta Q},$$

where Q represents the total heat dissipation from all the components in the racks 102a-102n of the data center 100 and δQ represents the rise in enthalpy of the airflow before entering the racks 102a-102n. The SHI and manners in which it may be determined are described in greater detail in co-pending and commonly assigned U.S. patent application Ser. No. 10/446,854, filed on May 29, 2003, and entitled "Air Recirculation Index", the disclosure of which is hereby incorporated by reference in its entirety.

The relationship between the matrix of the re-circulation mass flow rate Γ and SHI may be represented as follows:

Equation (5):
$$\Gamma^* \approx \frac{\delta Q}{Q} = \frac{SHI}{1 - SHI},$$

where Γ* is the dimensionless form of Γ. Thus, by determining SHI, the matrix of re-circulation mass flow rate matrix Γ may also be estimated for the racks 102a-102n. In this regard, the controller 204 may optionally comprise an SHI calculation module 230 as shown in FIG. 2. The SHI calculation module 230 is generally configured to calculate SHI values and to communicate those values to the VTI calculation module 214. The VTI calculation module 214 may factor the SHI values in calculating the VTI matrix of Equation (3).

The VTI calculation module 214 may also be configured to calculate VTI based upon the temperature and mass flow rates of airflow through the racks 102a-102n and the vent tiles 118a-118n. In addition, the mass flow rates and temperatures of airflow supplied to the racks 102a-102n may be calculated based upon the VTI and the mass flow rates and temperatures of airflow supplied by the vent tiles 118a-118n and a re-circulation matrix RM, according to the following equation:

$$[C_p M_R][T_R] = [[VTI] \cdot [C_p M_{VT}][T_{VT}]] + [RM],$$  Equation (6):

where $T_R$ is the inlet temperature matrix of the racks 102a-102n, $T_{VT}$ is the supply temperature matrix of the vent tiles 118a-118n, and $C_p$ is the specific heat capacity of air. In Equation (6), the multiplication [X][Y] denotes elemental multiplication where each element in [X] is multiplied by its corresponding element in [Y]. In addition, RM=(Γ)*$T_{rec}$*$C_p$ and the units of RM may be Watts. Thus, for instance, if the mass flow rates of air supplied through the vent tiles 118a-118n and the temperatures at the racks 102a-102n are known, these values may be used to estimate Γ through, for instance, Equation (4). However, as described below, the change in RM may approach zero or may otherwise constitute a relatively small number and may, in most instances, be disregarded.

Equation (6) may be further refined through detection of the mass flow rates and temperatures at various times (t). For instance, if at time t=i+1, the mass flow rate through a single vent tile 118 changes while the supply temperature remains constant, Equation (6) may be evaluated at time t=i and again at time t=i+1. If the difference is taken for these times, the following equation is obtained:

$$[C_p M_R][T_R]_i - [C_p M_R][T_R]_{i+1} = [[VTI] \cdot [C_p M_{VT}][T_{VT}]]_i - [[VTI] \cdot [C_p M_{VT}][T_{VT}]]_{i+1} + [RM]_i - [RM]_{i+1}$$  Equation (7):

When a single rack (for instance, rack A) is considered with N number of vent tiles 118a-118n, Equation (7) may be re-written as:

$$[C_p M_R \Delta T_R]_A = [VTI]_A \cdot [C_p \Delta M_{VT} T_{VT}] + [\Delta RM]_A,$$  Equation (8):

where $[M_R \Delta T_R]_A$ is a 1×N matrix and represents the product of the mass flow rate and inlet temperature change for a single rack (A) in the data center, $[VTI]_A$ is a 1×N matrix and is the vent tile index coefficient for rack A, $[\Delta M_{VT} T_{VT}]_A$ is an N×M matrix and is the product of change in tile flow rate and temperature of the airflow supplied by each vent tile 118a-118n in the data center 100 as the vent tile 118a-118n openings are varied sequentially N times, and $[\Delta RM]_A$ is the 1×N re-circulation matrix for rack A.

In certain instances, it may be assumed that the change in re-circulation at a rack (A) due to the adjustment of a single vent tile 118 is insignificant. In these instances, it may be assumed then that $[\Delta RM]_A \rightarrow [10]$ and Equation (8) may be solved for $[VTI]_A$, which may represent a single row in [VTI] of Equation (6).

In other instances, the re-circulation at the racks 102a-102n may be considered in determining VTI. In these instances, the following equation may be employed to determine VTI while factoring the effects of re-circulation:

Equation (9):

$$M_j^r = \sum_k^m VTI_{j,k} M_k^{vt} + \Gamma_j,$$

where M denotes the mass flow rates of air, r denotes the racks 102a-102n, vt denotes the vent tiles 118a-118n, j denotes the jth rack 102a-102n, k denotes the kth vent tile 118a-118n and is an index for the vent tiles 118a-118n, and m denotes the number of vent tiles k, where k→{1,m}. One such equation will exist for each rack 102a-102n. Thus, each rack 102a-102n will have to solve m equations for the unknown coefficients VTI. In other words, a total of m runs have to be carried out while measuring data at the n racks 102a-102n to calculate the coefficients VTI for all the rack 102a-102n and vent tile 118a-118n combinations. Dividing both sides of Equation (9) by the rack mass flow M, the following equation is obtained:

Equation (10):

$$1 = \frac{\sum_k^m VTI_{j,k} M_k^{vt}}{M_j^r} + \frac{\Gamma_j}{M_j^r}.$$

Equation (10) may be re-written with dimensionless parameters, which are denoted by * superscripts, as follows:

Equation (11):

$$1 = \sum_k^m VTI_{j,k} M_k^{*vt} + \Gamma_j^*.$$

The dimensionless re-circulation term $\Gamma$ may also be re-written as follows:

Equation (12):

$$\Gamma_j^* = \frac{\Gamma_j}{M_j^r} = \frac{\Gamma_j(T_{out} - T_{in})}{M_j^r(T_{out} - T_{in})} \approx \frac{\delta Q}{Q} = \frac{SHI}{1-SHI},$$

where $T_{out}$ and $T_{in}$ are the temperatures at the outlet and the inlet of a rack 102a-102n, respectively. The numerator shows the re-circulation heat load dissipated by the re-circulation stream (or external path) and assumes minimal heat loss to the environment. In addition, the numerator shows that the re-circulation stream is fully mixed with the inlet stream prior to being pulled through the rack 102a-102n. The denominator shows the heat load gained by the airflow through the rack 102a-102n. The ratio of re-circulation flow over the mass flow rate of air supplied to the rack may thus be approximated to the ratio of re-circulation load to the actual heat load.

Through substitution, Equation (11) may be re-written as follows:

Equation (13):

$$\sum_k^m VTI_{j,k} M_k^{*vt} + \frac{SHI}{1-SHI} = 1.$$

In determining VTI, a total of m runs may be performed while measuring data at the racks 102a-102n to calculate the coefficients for all of the rack 102a-102n and vent tile 118a-118n combinations. Therefore, for each rack 102a-102n, m number of equations is solved to determine all of the VTI values. Various manners in which VTI may be calculated according to performance of a number of runs will now be described in greater detail herein below with reference first to FIG. 3A.

Figure 3A:
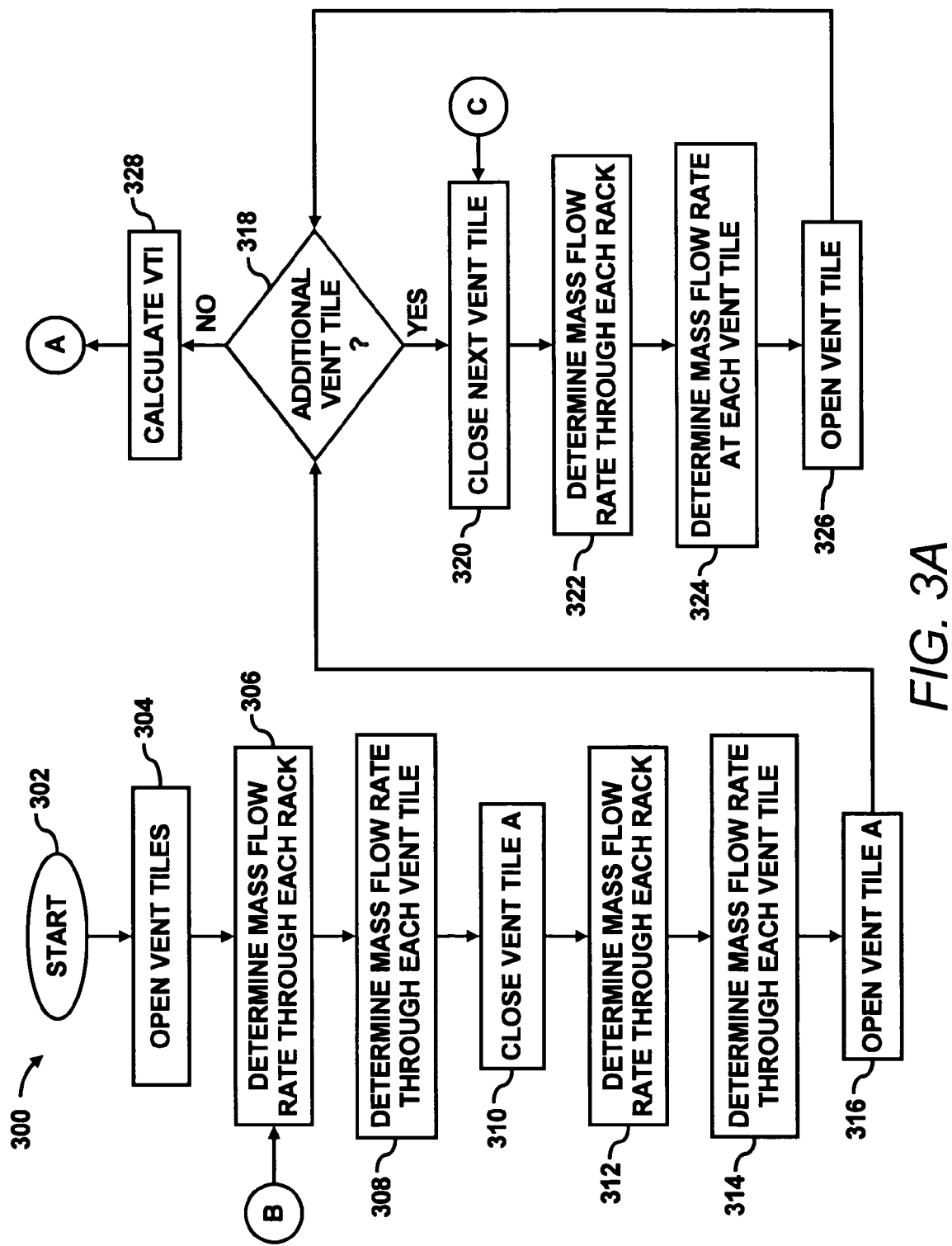
FIG. 3A illustrates a flow diagram of an operational mode for determining a vent tile influence coefficient (VTI), according to an embodiment of the invention.

FIG. 3A illustrates a flow diagram of an operational mode 300 for determining a vent tile influence coefficient (VTI). It is to be understood that the following description of the operational mode 300 is but one manner of a variety of different manners in which the VTI could be determined. It should also be apparent to those of ordinary skill in the art that the operational mode 300 represents a generalized illustration and that other steps may be added or existing steps may be removed or modified without departing from the scope of the operational mode 300. The description of the operational mode 300 is made with reference to the block diagram 200 illustrated in FIG. 2, and thus makes reference to the elements cited therein.

The operational mode 300 may be initiated in response to a variety of stimuli at step 302. For example, the operational mode 300 may be initiated in response to a predetermined lapse of time, in response to receipt of a transmitted signal, manually initiated, etc. At step 304, all of the vent tiles 118a-118n of a particular group of vent tiles 118a-118n may be opened (or fan assemblies 152 may be activated). The particular group of vent tiles 118a-118n may include a particular rack 102a-102n, a plurality of racks in a group of racks 102a-102n, all of the racks 102a-102n in a data center 100, etc. In addition, the particular group of vent tiles 118a-118n may comprise all of the vent tiles 118a-118n in a particular row, all of the vent tiles 118a-118n that are supplied with cooled airflow by a particular CRAC unit 114, all of the vent tiles 118a-118n that are supplied with cooled airflow by a plurality of CRAC units 114, etc. Opening of the vent tiles 118a-118n may include activating the motors 156 of vent tiles 118a-118n equipped with fan assemblies 152 to cause the fans 154 to rotate at a predetermined speed. The fan 154 speed and the opening of the vent tiles 118a-118n are to be taken as being synonymous throughout the present disclosure. Thus, if the vent tiles 118a-118n are described as being 100% open, this is equivalent to a vent tile 118a-118n equipped with a fan assembly 152 operating at 100%.

In one example, the vent tiles 118a-118n may be opened to 100% open. In other examples, the vent tiles 118a-118n may be opened to various levels and the operational mode 300 may be repeated at the various levels. For instance, during a first iteration of the operational mode 300, the vent tiles 118a-118n may be opened to 100% open, to 90% open during a second iteration, to 80% open during a third iteration, and so forth. Determination of VTI at the various vent tile 118a-118n settings may be beneficial since VTI may change during operation of the vent tiles 118a-118n. More particularly, as the global set of vent tiles 118a-118n change, so too will the VTI. Thus, if the global set of vent tile 118a-118n configurations changes, the correct $VTI_i$, where i=global vent tile 118a-118n configuration, may be employed to determine the relationships between the racks 102a-102n and the vent tiles 118a-118n.

In any regard, at step 306, the mass flow rates of airflow delivered to each of the racks 102a-102n may be determined. The mass flow rates of airflow delivered to each of the racks 102a-102n may be detected through use of mass flow rate sensors 210. Alternatively, the mass flow rates of airflow may be estimated through various other means. For instance, the mass flow rates may be estimated through use of temperature drop detection along with power draw detection, pressure differences, fan speeds, etc. The mass flow rates of airflow may be transmitted or otherwise sent to the input/output module 206 and may also be stored in the memory 212.

In addition, the mass flow rate of airflow supplied by each vent tile 118a-118n may be determined at step 308. Again, the mass flow rates of airflow supplied by each vent tile 118a-118n may be detected by mass flow rate sensors or they may be estimated through other means as described herein above. In addition, the mass flow rates of airflow supplied by each vent tile 118a-118n may be transmitted or otherwise sent to the input/output module 206 and may also be stored in the memory 212.

At step 310, one of the vent tiles 118a-118n, for instance, vent tile 118a, may be closed to substantially prevent the flow of air therethrough. The selection of which one of the vent tiles 118a-118n to close may be predetermined or it may be random. In any respect, the mass flow rates of airflow through the racks 102a-102n may be determined at step 312 and the mass flow rates of airflow through each open vent tile 118b-118n may be determined at step 314. The mass flow rates of airflow through the racks 102a-102n and the vent tiles 118b-118n may be determined as described herein above with respect to steps 306 and 308, respectively. In addition, the mass flow rates of airflow through the racks 102a-102n and the vent tiles 118b-118n may be stored in the memory 212.

The vent tile 118a that was closed at step 310 may be opened at step 316. This vent tile 118a may be opened to the percentage it was open at step 304.

At step 318, it may be determined whether another vent tile 118a-118n is to be closed. In one example, the "yes" condition may be reached at step 318 until conditions for each of the vent tiles 118a-118n being in closed positions have been determined. In another example, the "yes" condition at step 318 may be reached for a predetermined number of vent tiles 118a-118n equaling less than all of the vent tiles 118a-118n. In any respect, the determination of whether to close another vent tile 118a-118n may be made by the controller 204.

If it is determined that another vent tile 118a-118n is to be closed, another vent tile 118a-118n, for instance, vent tile 118b, may be closed at step 320. Again, the selection of which one of the vent tiles 118a-118n to close may be predetermined or it may be random. In any respect, the mass flow rates of airflow through the racks 102a-102n may be determined again at step 322 and the mass flow rates of airflow through each open vent tile 118b-118n may be determined at step 324. The mass flow rates of airflow through the racks 102a-102n and the vent tiles 118a, 118c-118n may be determined as described herein above with respect to steps 306 and 308, respectively. In addition, the mass flow rates of airflow through the racks 102a-102n and the vent tiles 118a, 118c-118n may be stored in the memory 212.

The vent tile 118b that was closed at step 320 may be opened at step 326. This vent tile 118b may also be opened to the percentage it was open at step 304.

Following step 326, it may be determined if another vent tile 118a-118n is to be closed at step 318. Steps 318-326 may be repeated for a predetermined number of times or until the conditions for each of the vent tiles 118a-118n being closed have been determined. In this case, which equates to a "no" condition at step 318, the controller 204 may calculate the VTI, as indicated at step 328. More particularly, the VTI calculation module 214 of the controller 204 may calculate the VTI based upon the information regarding the determined mass flow rates through the racks 102a-102n and the vent tiles 118a-118n with various vent tiles 118a-118n closed stored in the memory 212. As described in greater detail herein above, the VTI calculation module 214 may be configured to calculate the VTI in matrix form according to Equation (1).

Although the operational mode 300 may end following calculation of the VTI at step 328, optional procedures may be implemented in various circumstances. The optional procedures may be implemented, for instance, in cases where the blowers of CRAC units 114 are over-provisioned, which may lead to an excessive amount of airflow being supplied from the vent tiles 118a-118n. In some instances, this excessive flow may cause the airflow to dramatically exceed the flow necessary for the racks 102a-102n. In these instances, evaluation of VTI may not be possible. To overcome this possibility, the optional procedures depicted in FIGS. 3B and 3C may be implemented as alternative optional procedures.

In other instances, the mass flow rates of air supplied through the vent tiles 118a-118n may fall below or exceed the required mass flow rates of air required to safely operate the equipment housed in the racks 102a-102n. In these instances, an optional pre-commissioning procedure depicted in FIG. 3D may be implemented to substantially overcome these possibilities.

Figure 3B:
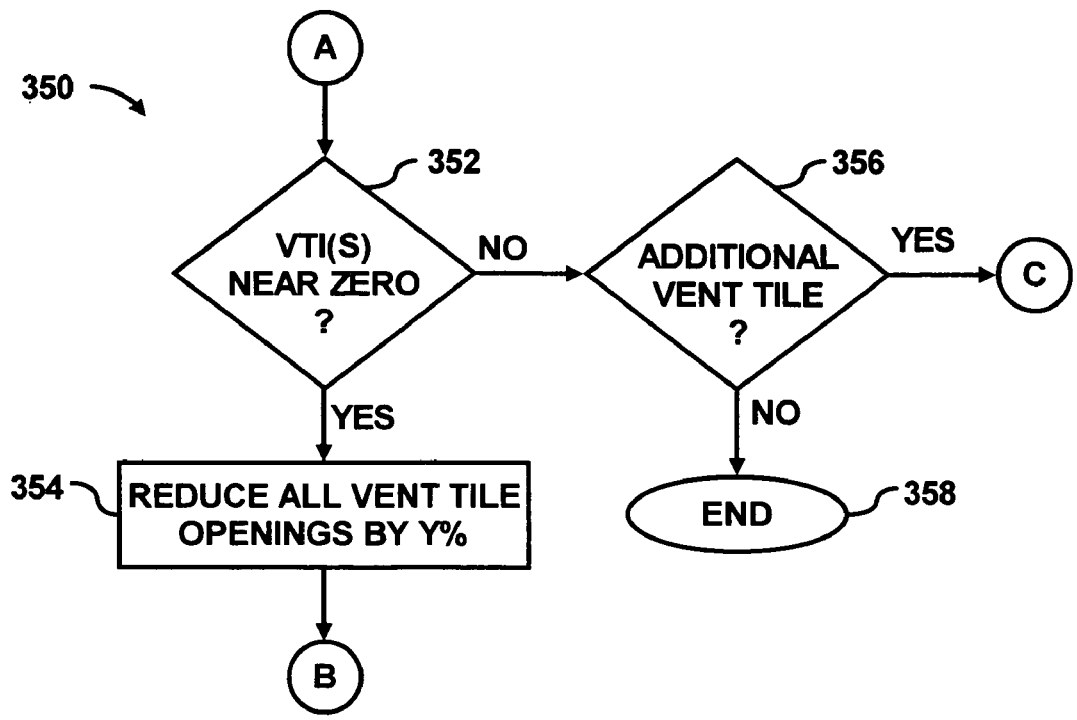
FIGS. 3B and 3C illustrate optional, alternative operational modes for correcting improper VTI determinations, according to embodiments of the invention.

With reference first to FIG. 3B, there is shown an operational mode 350 of a first optional method. As shown, following calculation of the VTI for a predetermined number of vent tiles 118a-118n, it is determined whether the values calculated for these vent tiles 118a-118n are near zero at step 352. If it is determined that the VTI values are near zero, the openings in the vent tiles 118a-118n or the speeds of the fans 154 may be reduced by a predetermined amount, for instance, Y %. The predetermined amount (Y) may be determined, for instance, through a trial and error process. By way of example, the vent tiles 118a-118n may be reduced by a 10% reduction and may be reduced by 10% increments for subsequent iterations of step 354. If it is found that the 10% reduction does not change VTI, then the predetermined amount may be increased. In one example, the reduction in the openings of vent tiles 118a-118n may be ceased when the vent tile 118a-118n openings have reached or are near limits prescribed for safe operation of the components 116. In addition, steps 306-328 may be repeated with the openings of the vent tiles 118a-118n reduced by the predetermined amount. Moreover, steps 352-358 may also be performed following steps 306-328.

If it is determined that the VTI values are not near zero at step 352, it may be determined whether additional vent tiles 118a-118n are to be closed at step 356. The determination made at step 356 is similar to the determination made at step 318. Thus, for instance, if the VTI was calculated for a smaller number of vent tiles 118a-118n than the entire set of vent tiles 118a-118n to be considered, then it may be determined that additional vent tiles 118a-118n are to be considered and steps 320-328 may be repeated. In addition, steps 352-358 may also be performed depending upon the outcome of the VTI calculation performed at step 328.

If, however, it is determined that no further vent tiles 118a-118n are to be considered at step 356, the operational modes 300 and 350 may end as indicated at step 358. The end condition at step 358 may comprise a standby mode since the operational modes 300 and 350 may be re-initiated in response to a receipt of a signal to re-initiate, after a predetermined lapse of time, manually re-initiated, etc.

Figure 3C:
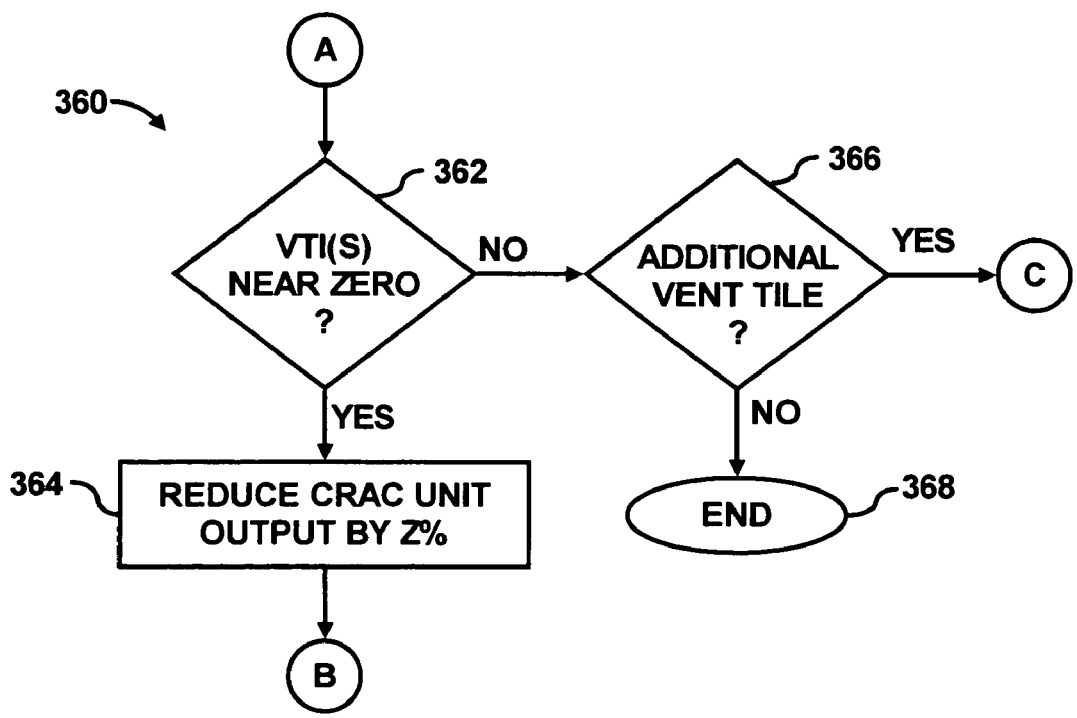

With reference now to FIG. 3C, there is shown an operational mode 360 of a second optional method. As shown, following calculation of the VTI for a predetermined number of vent tiles 118a-118n, it is determined whether the values calculated for these vent tiles 118a-118n are near zero at step 362. If it is determined that the VTI values are near zero, the outputs of one or more CRAC units 114 may be reduced by a predetermined amount, for instance, Z %. The predetermined amount (Z) may be determined, for instance, through a trial and error process. By way of example, the outputs of one or more CRAC units 114 may be reduced by 10% and may be further reduced by 10% increments for subsequent iterations of step 364. If it is found that the 10% reduction does not change VTI, then the predetermined amount may be increased. However, the level to which the outputs of the one or more CRAC units 114 are reduced may be limited based upon the operational requirements of the one or more CRAC units 114. These operational requirements may include minimum allowable temperature set points or blower output set points.

The outputs of the one or more CRAC units 114 may be reduced, for instance, by reducing the speed of the blowers configured to supply cooled airflow into the space 112. In addition, steps 306-328 may be repeated with the outputs of the one or more CRAC units 114 reduced by the predetermined amount. Moreover, steps 362-368 may also be performed following steps 306-328.

As with the operational mode 350, if it is determined that all of the VTI values are not near zero at step 362, it may be determined whether additional vent tiles 118a-118n are to be closed at step 366. The determination made at step 366 is similar to the determination made at step 318. Thus, for instance, if the VTI was calculated for a smaller number of vent tiles 118a-118n than the entire set of vent tiles 118a-118n to be considered, then it may be determined that additional vent tiles 118a-118n are to be considered and steps 320-328 may be repeated. In addition, steps 362-368 may also be performed depending upon the outcome of the VTI calculation performed at step 328.

If, however, it is determined that no further vent tiles 118a-118n are to be considered at step 366, the operational modes 300 and 360 may end as indicated at step 368. The end condition at step 368 may comprise a standby mode since the operational modes 300 and 360 may be re-initiated in response to a receipt of a signal to re-initiate, after a predetermined lapse of time, manually re-initiated, etc.

Figure 3D:
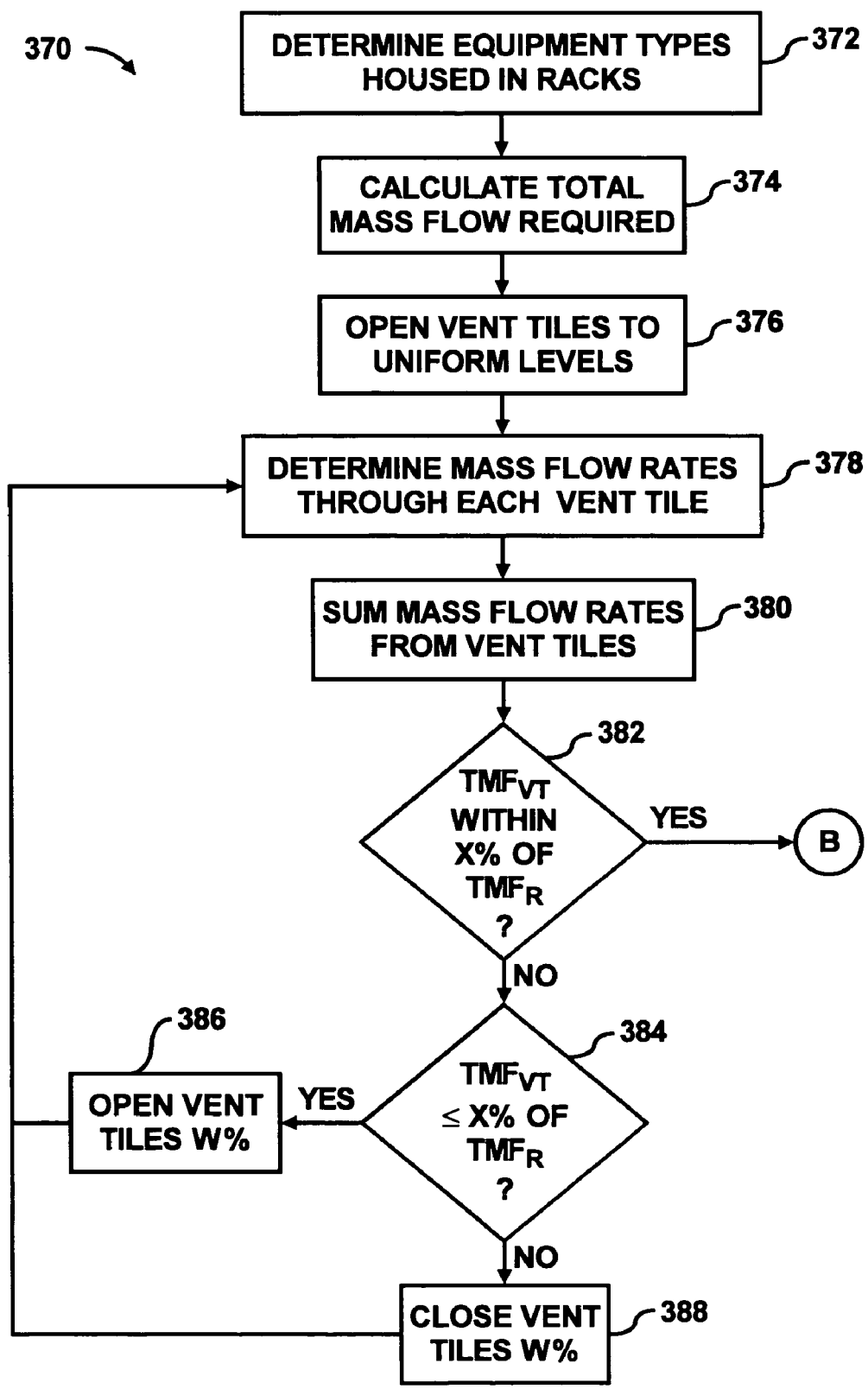
FIG. 3D illustrates an optional pre-commissioning operational mode according to an embodiment of the invention.

Referring to FIG. 3D, there is shown an operational mode 370 of an optional pre-commissioning method. The operational mode 370 may be performed prior to step 306 to generally enable a determination of whether the total mass flow rate of air through the vent tiles 118a-118n is sufficient for the mass flow rates required by the equipment housed in the racks 102a-102n. In addition, the operational mode 370 may be performed to determine whether the total mass flow rates of air supplied through the vent tiles 118a-118n exceeds a predetermined level. The flow rates of air through the vent tiles 118a-118n may also be varied through implementation of the operational mode 370, such that the total mass flow rate of air supplied through the vent tiles 118a-118n is within a predefined percentage of the total mass flow rate required by the equipment housed in the racks 102a-102n. In one example, the operational mode 370 may be implemented to determine the level to which the vent tiles 118a-118n are opened at step 304.

As shown in FIG. 3D, the types of equipment housed in the racks 102a-102n may be determined at step 372. This information may be compiled into a table or chart and stored in the memory 212. In addition, the table or chart may include information pertaining to the mass flow rates of air required by the equipment to be safely operated. Alternatively, this information may include recommended airflow rates for the equipment. In any respect, the total mass flow rates of air required to operate the equipment may be calculated at step 374, for instance, by totaling the individual airflow requirements of each piece of equipment.

At step 376, the vent tiles 118a-118n may all be opened to uniform levels, such that the mass flow rates of airflow supplied through the vent tiles 118a-118n are approximately equivalent for each of the vent tiles 118a-118n. The vent tiles 118a-118n may be set between, for instance, around 25-100% open. At step 378, the mass flow rates of air supplied through each of the vent tiles 118a-118n may be determined. The mass flow rates may be determined in any of the manners described herein above with respect to step 308. In addition, the mass flow rates of air supplied through each of the vent tiles 118a-118n may be summed to obtain a total mass flow rate amount at step 380. At step 382, the total mass flow rate (TMF) of air supplied through each of the vent tiles 118a-118n ($TMF_{VT}$) is compared with the total mass flow rate (TMF) of air required by the equipment housed in the racks 102a-102n ($TMF_R$) to determine whether the $TMF_{VT}$ is within a predetermined percentage (X %) of the $TMF_R$. Although the comparison between the flow rates at step 382 has been described with percentages, the comparison may be based upon any other reasonably suitable method of determining whether values are within a predetermined range from other values. For instance, the comparison may be based upon preset difference in flow rate value, etc.

In addition, the predetermined percentage (X %) may comprise any reasonably suitable percentage value and may be user defined. According to an example, however, the predetermined percentage (X %) may be approximately 10-20%.

In any regard, if the $TMF_{VT}$ is within the predetermined percentage (X %) of the $TMF_R$, the operational mode 370 may end and the operational mode 300 may be performed beginning at step 304. In addition, the vent tiles 118a-118n may be at the level of opening indicated at step 376. However, if the $TMF_{VT}$ is not within the predetermined percentage (X %) of the $TMF_R$, it may be determined as to whether the $TMF_{VT}$ falls below or equals the predetermined percentage (X %) of the $TMF_R$ at step 384.

If the $TMF_{VT}$ falls below or equals the predetermined percentage (X %) of the $TMF_R$, the vent tiles 118a-118n may be opened by a predefined percentage (W %), as indicated at step 386. The predefined percentage (W) may be determined, for instance, through a trial and error process. By way of example, the openings of the vent tiles 118a-118n may be increased by 10% and may be further increased by 10% increments for subsequent iterations of step 386. If it is found that the 10% increase does not change VTI, then the predefined percentage (W) may be increased. In addition, steps 378-388 may be repeated until it is determined that the $TMF_{VT}$ is within the predetermined percentage (X %) of the $TMF_R$.

If the $TMF_{VT}$ exceeds the predetermined percentage (X %) of the $TMF_R$, the vent tiles 118a-118n may be closed by the predefined percentage (W %), as indicated at step 388. The predefined percentage (W) may be determined, for instance, through a trial and error process. By way of example, the openings of the vent tiles 118a-118n may be decreased by 10% and may be further decreased by 10% increments for subsequent iterations of step 388. If it is found that the 10% decrease does not change VTI, then the predefined percentage (W) may be decreased. The maximum levels to which the openings in the vent tiles 118a-118n are decreased may be limited to minimum levels of required airflow for the components 116 as set forth by, for instance, the component 116 manufacturers. Again, steps 378-388 may be repeated until it is determined that the $TMF_{VT}$ is within the predetermined percentage (X %) of the $TMF_R$.

Through implementation of the operational mode 300 and one or more of the optional operational modes 350, 360, and 370, the VTI may be determined, which may be used to determine the relationships between the racks 102a-102n and the vent tiles 118a-118n.

Figure 3E:
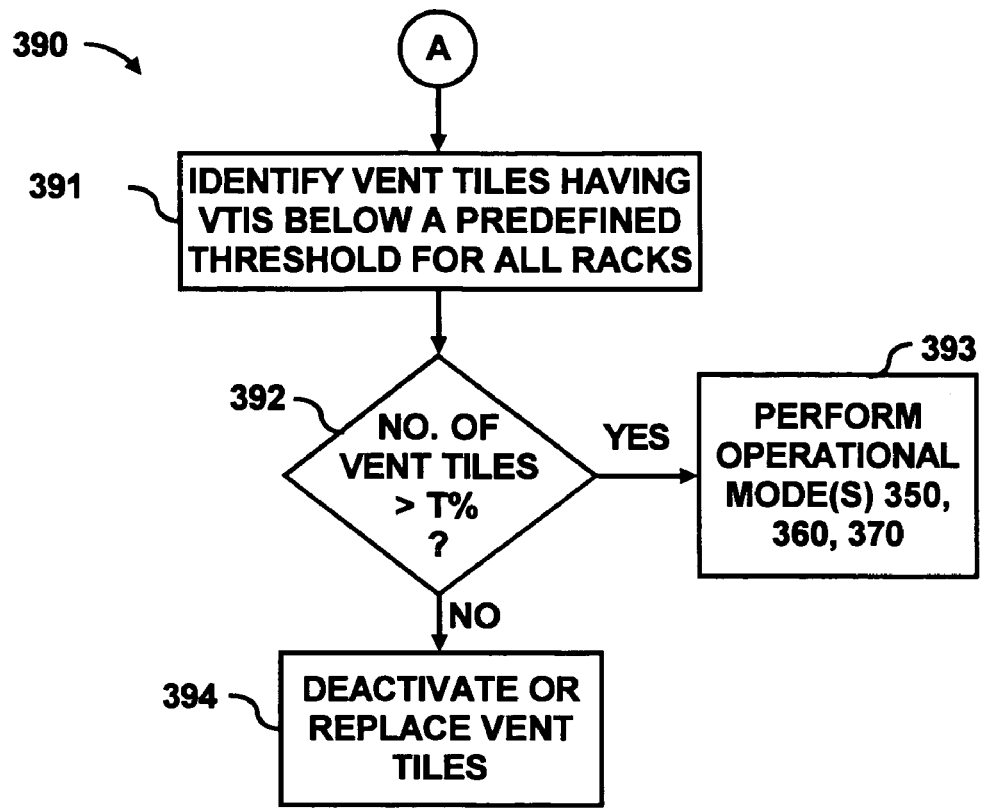
FIGS. 3E and 3F, illustrate alternative operational modes that may be employed with vent tiles that have little or no influence over any racks, according to embodiments of the invention.
Figure 3F:
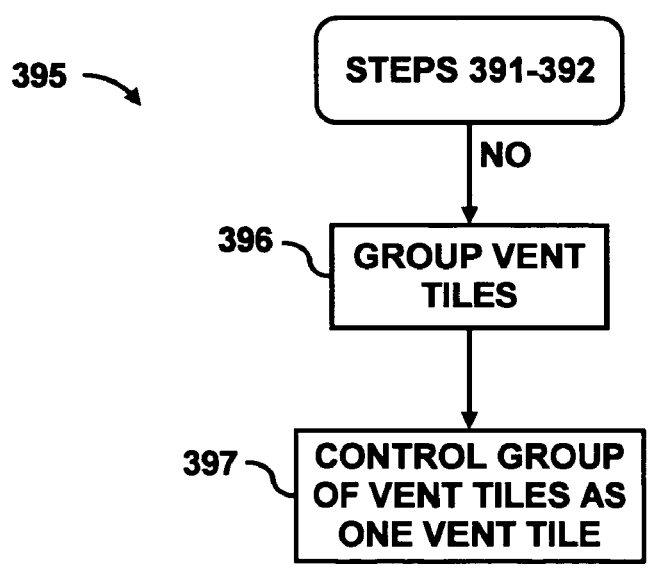

In addition, the VTI may be employed to identify vent tiles 118a-118n that may have relatively little or no influence over any of the racks 102a-102n. FIGS. 3E and 3F, illustrate alternative operational modes 390 and 395 that may be employed in situations where such vent tiles 118a-118n exist in a data center 100. In both of the operational modes 390 and 395, it is assumed that vent tiles 118a-118n that have relatively little or no influence over any of the racks 102a-102n have been detected based upon their calculated VTI values from the operational mode 300 (FIG. 3A).

With reference first to FIG. 3E and the operational mode 390, the vent tiles 118a-118n that have VTIs below a predefined threshold for all of the racks 102a-102n are identified at step 391. In other words, those vent tiles 118a-118n that have little or no influence over any of the racks 102a-102n may be determined and identified at step 391. The threshold may be determined based upon a plurality of factors. For instance, the threshold may be user-defined and may correlate to a desired percentage. By way of example, the threshold may be set at around 25%, such that, those vent tiles 118a-118n that have less than 25% influence over any particular rack 102a-102n may be identified at step 391.

At step 392, it may be determined whether the number of vent tiles 118a-118n identified at step 391 exceed a predetermined threshold (T %). Again, the predetermined threshold (T %) may be user-defined and may be based upon a desired percentage. Thus, for instance; if a certain percentage of all of the vent tiles 118a-118n, such as, 10-20% or more, is identified at step 391, then the steps outlined in one or more of the operational modes 350, 360, and 370 may be performed as indicated at step 393. In other words, the pre-commissioning steps outlined in any of those operational modes 350, 360, 370 may be performed to reduce the number of vent tiles 118a-118n that have little or no influence over any of the racks 102a-102n.

If it is determined at step 392 that the number of vent tiles 118a-118n identified at step 391 falls below or equals the predetermined threshold (T %), those identified vent tiles 118a-118n may be deactivated or replaced as indicated at step 394. At step 394, those identified vent tiles 118a-118n may be deactivated by closing them completely, removing power supply to those vent tiles 118a-118n, etc. Alternatively, those identified vent tiles 118a-118n may be replaced with standard vent tiles 118a-118n or tiles that do not have vents. In addition, those identified vent tiles 118a-118n may be installed in locations where vent tiles are known to have greater levels of influence over the racks 102a-102n. In this regard, the relatively more expensive vent tiles 118a-118n may be used more efficiently at locations where they may be of greater utility and the relatively less expensive tiles may be used in locations where vent tiles 118a-118n would not be of great use.

With reference now to FIG. 3F, following steps 391 and 392 in FIG. 3E, instead of performing step 394, the vent tiles 118a-118n identified at step 391 may be placed into one or more groups at step 396. The one or more groups may be formed according to the locations of the identified vent tiles 118a-118n. More particularly, vent tiles 118a-118n in close proximity to each other, for instance, adjacent vent tiles 118a-118n, may be placed in one group and other similarly situated vent tiles 118a-118n may be placed in another group. At step 397, each of the one or more groups formed of the vent tiles 118a-118n may be controlled as single vent tiles 118a-118n. In other words, a group of vent tiles 118a-118n may be controlled substantially simultaneously to influence airflow characteristics to particular racks 102a-102n.

Figure 4A:
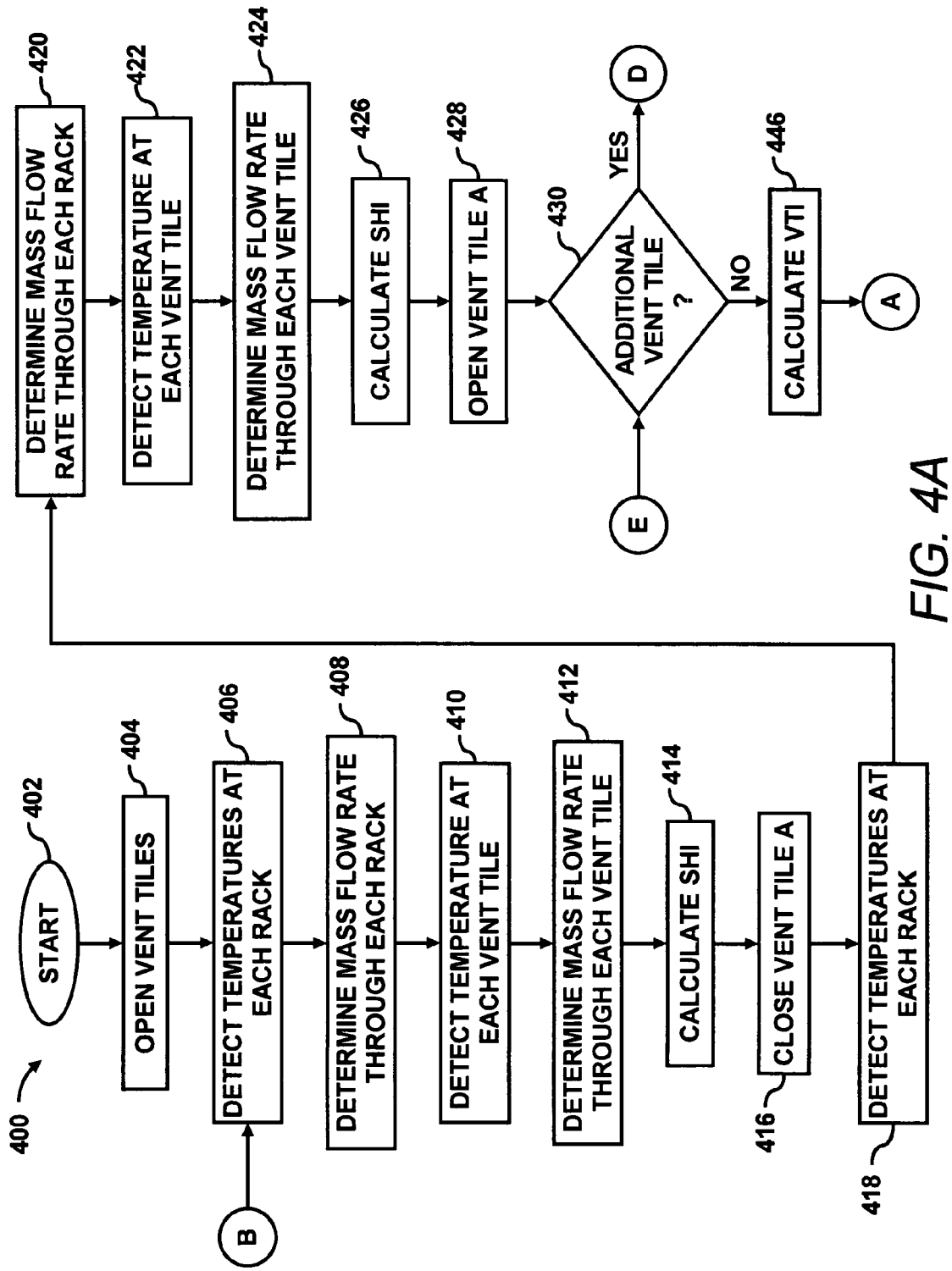
FIGS. 4A and 4B, collectively, illustrate a flow diagram of an operational mode for determining a vent tile influence coefficient (VTI), according to another embodiment of the invention.
Figure 4B:
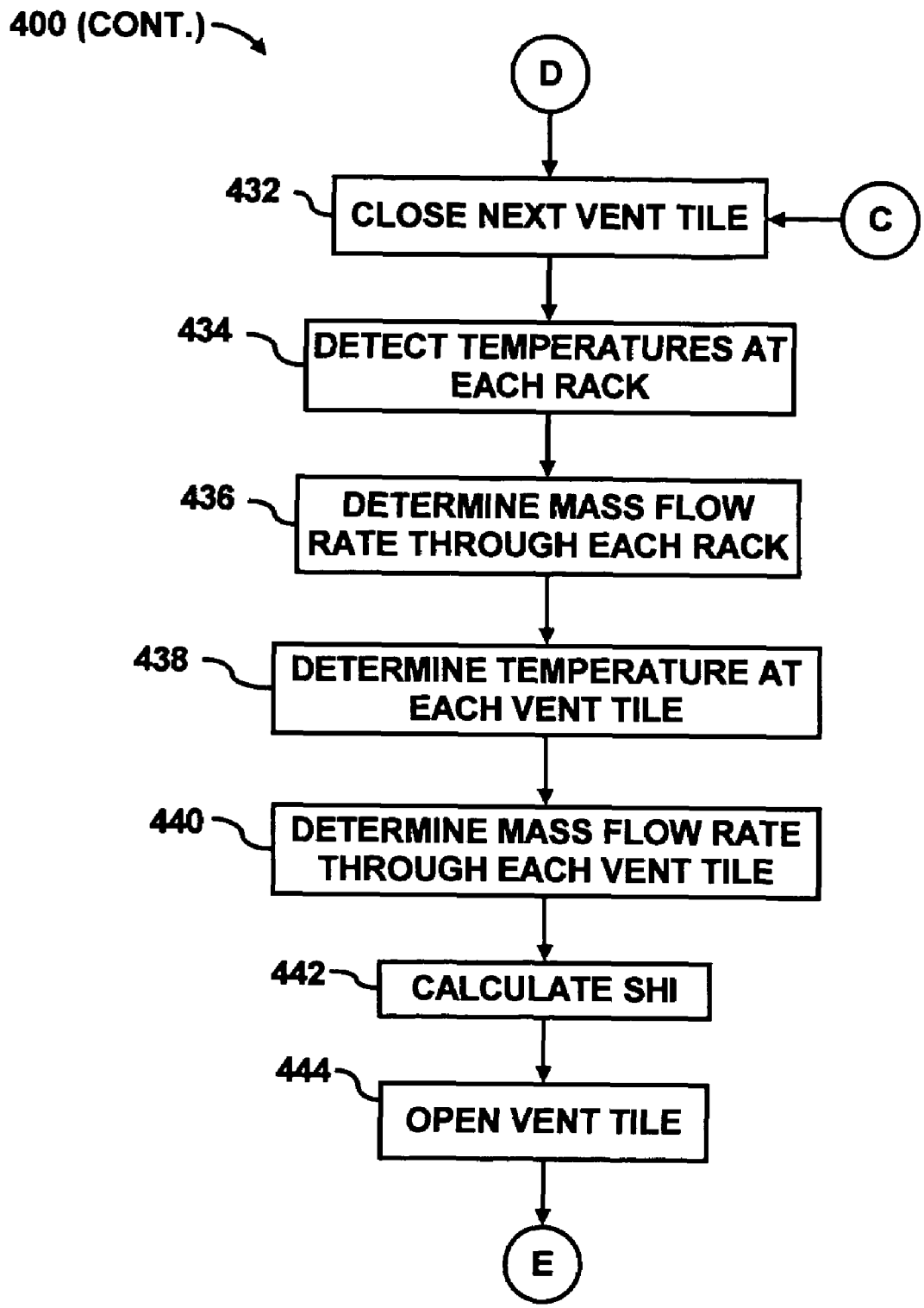

FIGS. 4A and 4B, collectively, illustrate a flow diagram of an operational mode 400 for determining a vent tile influence coefficient (VTI), in which the effects of re-circulation are factored in determining the VTI. It is to be understood that the following description of the operational mode 400 is but one manner of a variety of different manners in which the VTI could be determined. It should also be apparent to those of ordinary skill in the art that the operational mode 400 represents a generalized illustration and that other steps may be added or existing steps may be removed or modified without departing from a scope of the operational mode 400. The description of the operational mode 400 is made with reference to the block diagram 200 illustrated in FIG. 2, and thus makes reference to the elements cited therein.

The operational mode 400 may be initiated in response to a variety of stimuli at step 402. For example, the operational mode 400 may be initiated in response to a predetermined lapse of time, in response to receipt of a transmitted signal; manually initiated, etc. At step 404, all of the vent tiles 118a-118n of a particular group of vent tiles 118a-118n may be opened in manners similar to those described herein above with respect to step 304 in FIG. 3A.

At step 406, the temperatures at the inlets and the outlets of the racks 102a-102n may be detected. In certain instances, the temperatures at the inlets and the outlets of the racks 102a-102n may be detected by the temperature sensors 208. In other instances, the temperatures may be detected by hand with a handheld device, with an adequately equipped semi-autonomous mobile sensor device, etc. In any event, the detected temperatures may be inputted into or transmitted to the controller 204 and may be stored in the memory 212.

In similar fashion to step 306 in FIG. 3A, the mass flow rates of airflow delivered to each of the racks 102a-102n may be determined at step 408. In addition, the mass flow rates of airflow delivered to the racks 102a-102n may be transmitted or otherwise sent to the input/output module 206 of the controller 204 and may also be stored in the memory 212.

At step 410, the temperatures of the airflow supplied by the vent tiles 118a-118n may be detected. These temperatures may be detected by the temperature sensors 208, by hand with a handheld device, with an adequately equipped semi-autonomous mobile sensor device, etc. In addition, the detected temperatures may be inputted or transmitted to the controller 204 and may be stored in the memory 212.

At step 412, the mass flow rate of airflow through the vent tiles 118a-118n may be determined in manners similar to those described herein above with respect to step 308. In addition, the mass flow rates of airflow supplied through the vent tiles 118a-118n may be transmitted or otherwise sent to the input/output module 206 of the controller 204 and may also be stored in the memory 212.

The temperatures detected at the racks 102a-102n and the vent tiles 118a-118n may be employed to calculate SHI, as indicated at step 414. In addition, the calculated SHI may be stored in the memory 212. As described in co-pending U.S. patent application Ser. No. 10/446,854, SHI may be determined through the following equation:

Equation (14):

$$SHI = \frac{\sum_j \sum_i ((T_{in}^r)_{i,j} - T_{ref})}{\sum_j \sum_i ((T_{out}^r)_{i,j} - T_{ref})},$$

where $(T^r{}_{in})_{i,j}$ and $(T^r{}_{out})_{i,j}$ are the respective inlet and outlet temperatures from the ith rack in the jth row of racks. In addition, $T_{ref}$ denotes the temperature of the cooled air supplied by one or more of the CRAC units 114 and may denote the average temperature of the airflow supplied through the vent tiles 118a-118n.

At step 416, one of the vent tiles 118a-118n, for instance, vent tile 118a, may be closed to substantially prevent the flow of air therethrough. The selection of which of the vent tiles 118a-118n may be based upon the manners described herein above with respect to step 310. In any respect, the temperatures at the inlets and the outlets of the racks 102a-102n may be detected at step 418, the mass flow rates of airflow delivered to each of the racks 102a-102n may be determined at step 420, the temperatures of the airflow supplied by the vent tiles 118a-118n may be detected at step 422, and the mass flow rate of airflow through the vent tiles 118a-118n may be determined at step 424. The temperatures detected at steps 418 and 422 may be employed to calculate the SHI at step 426. In addition, the determinations made at steps 418-426 may be stored in the memory 212.

The vent tile 118a that was closed at step 416 may be opened at step 428. This vent tile 118a may be opened to the percentage it was open at step 404.

At step 430, it may be determined whether another vent tile 118a-118n is to be closed. In one example, the "yes" condition may be reached at step 430 until conditions for each of the vent tiles 118a-118n being in closed positions have been determined. In another example, the "yes" condition at step 430 may be reached for a predetermined number of vent tiles 118a-118n equaling less than all of the vent tiles 118a-118n. In any respect, the determination of whether to close another vent tile 118a-118n may be made by the controller 204.

If it is determined that another vent tile 118a-118n is to be closed, another vent tile 118a-118n, for instance, vent tile 118b, may be closed at step 432. Again, the selection of which one of the vent tiles 118a-118n to close may be predetermined or it may be random. In any respect, the temperatures at the inlets and the outlets of the racks 102a-102n may be detected at step 434, the mass flow rates of airflow delivered to each of the racks 102a-102n may be determined at step 436, the temperatures of the airflow supplied by the vent tiles 118a, 118ac-118n may be detected at step 438, and the mass flow rate of airflow through the vent tiles 118a, 118c-118n may be determined at step 440. The temperatures detected at steps 434 and 438 may be employed to calculate the SHI at step 442. In addition, the determinations made at steps 434-442 may be stored in the memory 212.

The vent tile 118b that was closed at step 432 may be opened at step 444. This vent tile 118b may also be opened to the percentage it was open at step 404.

Following step 444, it may be determined if another vent tile 118a-118n is to be closed at step 430. Steps 432-444 may be repeated for a predetermined number of times or until the conditions for each of the vent tiles 118a-118n being closed have been determined. In this case, which equates to a "no" condition at step 430, the controller 204 may calculate the VTI, as indicated at step 446. More particularly, the VTI calculation module 214 of the controller 204 may calculate the VTI based upon the information stored in the memory 212 regarding the detected temperatures at the inlets of the racks 118a-118n, the determined mass flow rates through the racks 102a-102n and the vent tiles 118a-118n, and the SHI's with various vent tiles 118a-118n closed. As described in greater detail herein above, the VTI calculation module 214 may be configured to calculate the VTI in matrix form according to Equations (3), (8), (9), or (13).

Although the operational mode 400 may end following calculation of the VTI at step 446, optional procedures may be implemented in various circumstances. The optional procedures may be implemented, for instance, in cases where the blowers of CRAC units 114 are over-provisioned, which may lead to an excessive amount of airflow being ejected from the vent tiles 118a-118n. In some instances, this excessive flow may cause the airflow to dramatically exceed the flow necessary for the racks 102a-102n. In these instances, evaluation of VTI may not be possible. As described in detail herein above, to overcome this possibility, the optional procedures depicted in FIGS. 3B and 3C may be implemented as alternative optional procedures.

In other instances, the mass flow rates of air supplied through the vent tiles 118a-118n may fall below or exceed the required mass flow rates of air required to safely operate the equipment housed in the racks 102a-102n. In these instances and as also described herein above, an optional pre-commissioning procedure depicted in FIG. 3D may be implemented to substantially overcome these possibilities.

In addition, the operational modes 390 and 395 may be performed following operational mode 400 to identify and deactivate, replace, or group, vent tiles 118a-118n that have little or no influence over any of the racks 102a-102n.

In certain examples, calculation of SHI at steps 414, 426, and 442 may be omitted. For instance, these steps may be omitted if it may be assumed that changes in re-circulation due to the closure of a single vent tile 118a-118n are substantially minute. In this instances, the $\Delta\Gamma$ in Equations (3), (8), (9), or (13) may be considered as equaling zero. In this regard, the $\Delta\Gamma$ may be omitted from Equations (3), (8), (9), or (13) and Equations (3), (8), (9), or (13) may be solve determine VTI without considering $\Delta\Gamma$.

The operations illustrated in the operational modes 300, 350, 360, 370, 390, 395, and 400 may be contained as a utility, program, or a subprogram, in any desired computer accessible medium. In addition, the operational modes and 300, 350, 360, 370, 390, 395, and 400 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
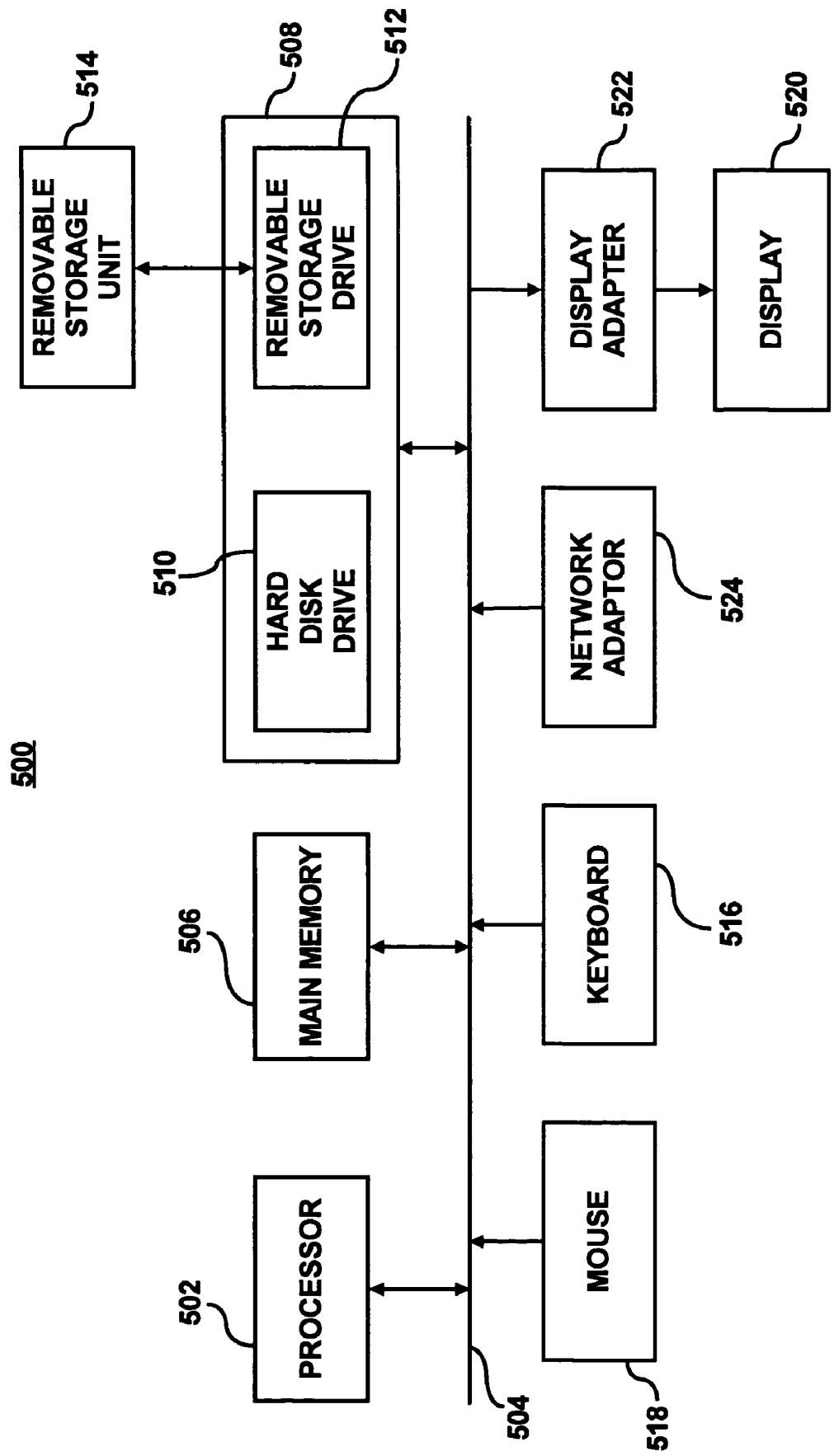
FIG. 5 illustrates a computer system, which may be employed to perform various functions described herein, according to an embodiment of the invention.

FIG. 5 illustrates a computer system 500, which may be employed to perform various functions described herein. The computer system 500 may include, for example, the computing device 128 and/or the controller 204. In this respect, the computer system 500 may be used as a platform for executing one or more of the functions described herein above with respect to the various components of the vent tile influence evaluation system 202.

The computer system 500 includes one or more controllers, such as a processor 502. The processor 502 may be used to execute some or all of the steps described in the operational modes 300, 350, 360, 370, and 400. Commands and data from the processor 502 are communicated over a communication bus 504. The computer system 500 also includes a main memory 506, such as a random access memory (RAM), where the program code for, for instance, the computing device 128 or the controller 204, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the vent tile evaluation system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, for instance, the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (e.g., user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for correlating vent tiles with racks, said method comprising:
   (a) setting the vent tiles to a first setting;
   (b) determining mass flow rates of air received by the racks;
   (c) determining mass flow rates of air supplied through the vent tiles;
   (d) closing one of the vent tiles to obtain a second setting;
   (e) repeating steps (b) and (c); and
   (f) correlating the vent tiles and the racks based upon the determined mass flow rates of air received by the racks and the mass flow rates of air supplied through the vent tiles at the first and second settings.

2. The method according to claim 1, further comprising:
   (g) opening the closed vent tile;
   (h) setting another vent tile to a third setting; and
   (i) repeating steps (b), (c) and (f), wherein step (f) comprises correlating the vent tiles and the racks based upon the determined mass flow rates of air received by the racks and the mass flow rates of air supplied through the vent tiles at the first, second and third settings.

3. The method according to claim 2, wherein the step of setting the vent tiles to a first setting comprises opening the vent tiles, wherein the step of setting another vent tile to a third setting comprises closing the another vent tile.

4. The method according to claim 1, wherein the vent tiles comprise fan assemblies, wherein the step of setting the vent tiles to a first setting comprises activating the fan assemblies such that the fan assemblies cause airflow out of the vent tiles, and wherein the step of closing one of the vent tiles comprises deactivating one of the fan assemblies.

5. The method according to claim 1, wherein the step of correlating the vent tiles and the racks further comprises solving the following matrix equation:
   $[VTI]=[M_R]\cdot[M_{VT}]^{-1}$, wherein VTI is a vent tile influence coefficient matrix, $M_R$ is the vector of mass flow rates of air delivered to each rack and $M_{VT}$ is the vector of mass flow rates of air through each vent tile.

6. The method according to claim 1, wherein the racks include inlets and outlets, said method further comprising:
   detecting temperatures at the inlets and outlets of the racks;
   detecting temperatures of the air supplied by the vent tiles;
   calculating an index of re-circulation based upon the detected temperatures; and
   factoring the calculated index of re-circulation in correlating the vent tiles and the racks.

7. The method according to claim 6, wherein the step of factoring the calculated index of re-circulation further comprises solving the following matrix equation:
   $[M_R]=[VTI]\cdot[M_{VT}]+[\Gamma]$, wherein VTI is a vent tile influence coefficient matrix, $M_R$ is a vector of mass flow rates of air delivered to each rack, $M_{VT}$ is a vector of mass flow rates of air through each vent tile, and $\Gamma$ is a matrix of the re-circulation mass flow rate that infiltrates the inlets of the racks.

8. The method according to claim 1, wherein the racks include inlets, said method further comprising:

detecting temperatures at the inlets of the racks;

detecting temperatures of the air supplied by the vent tiles; and wherein the step of correlating the vent tiles and the racks comprises solving the following equation:

$[M_R \Delta T_R]_A = [VTI]_A \cdot [\Delta M_{VT} T_{VT}]$, wherein $[M_R \Delta T_R]_A$ is a 1×N matrix and represents a product of the mass flow rate and inlet temperature change for a single rack (A), $[VTI]_A$ is a 1×N matrix and is a vent tile index coefficient for rack A, and $[\Delta M_{VT} T_{TV}]_A$ is an N×M matrix and is a product of change in vent tile flow rates and temperatures of the airflow supplied by the vent tiles as the vent tile openings are varied sequentially N times.

9. The method according to claim 1, wherein the racks include inlets and outlets, said method further comprising:

detecting temperatures at the inlets and outlets of the racks;

detecting temperatures of the air supplied by the vent tiles;

calculating an index of re-circulation based upon the detected temperatures; and wherein the step of correlating the vent tiles and the racks comprises solving the following equation:

$[M_R \Delta T_R]_A = [VTI]_A \cdot [\Delta M_{VT} T_{VT}] + [\Delta \Gamma]_A$, wherein $[M_R \Delta T_R]_A$ is a 1×N matrix and represents a product of the mass flow rate and inlet temperature change for a single rack (A), $[VTI]_A$ is a 1×N matrix and is a vent tile index coefficient for rack A, $[\Delta M_{VT} T_{VT}]_A$ is an N×M matrix and is a product of change in vent tile flow rates and temperatures of the airflow supplied by the vent tiles as the vent tile openings are varied sequentially N times, and $[\Delta \Gamma]_A$ is the 1×N re-circulation matrix for rack A.

10. The method according to claim 1, wherein the racks include inlets and outlets, said method further comprising:

detecting temperatures at the inlets and outlets of the racks;

detecting temperatures of the air supplied by the vent tiles;

calculating an index of re-circulation (SHI) based upon the detected temperatures; and wherein the step of correlating the vent tiles and the racks comprises solving the following equation:

$$\sum_{k}^{m} VTI_{j,k} M_k^{vt} + \frac{SHI}{1-SHI} = 1,$$

wherein M denotes the mass flow rates of air, r denotes the racks, vt denotes the vent tiles, j denotes the jth rack, k denotes the kth vent tile, and m denotes the number of vent tiles, and wherein SHI is calculated through the following equation:

$$SHI = \frac{\sum_{j}\sum_{i}((T_{in}^r)_{i,j} - T_{ref})}{\sum_{j}\sum_{i}((T_{out}^r)_{i,j} - T_{ref})},$$

wherein $(T^r_{in})_{i,j}$ and $(T^r_{out})_{i,j}$ are the respective inlet and outlet temperatures from the ith rack in the jth row of racks and $T_{ref}$ denotes the average temperature of the airflow supplied through the vent tiles.

11. The method according to claim 1, wherein the step of correlating the vent tiles and the racks further comprises calculating a vent tile influence coefficient (VTI) having values, said method further comprising:

determining whether the values of the calculated VTI are near zero;

reducing the vent tile openings by a predefined amount in response to the values of the calculated VTI being near zero; and repeating steps (b)-(f).

12. The method according to claim 1, wherein the step of correlating the vent tiles and the racks further comprises calculating a vent tile influence coefficient (VTI) having values, and wherein the airflow supplied through the vent tiles is supplied by a CRAC unit, said method further comprising:

determining whether the values of the calculated VTI are near zero;

reducing output of the CRAC unit by a predefined amount in response to the values of the calculated VTI being near zero; and repeating steps (b)-(f).

13. The method according to claim 1, wherein the racks house equipment, said method further comprising:

determining total airflow requirements of the equipment housed in the racks;

opening the vent tiles to a uniform level;

determining mass flow rates of air supplied through the vent tiles;

summing the mass flow rates of air supplied through the vent tiles;

determining whether the summed mass flow rates of air supplied through the vent tiles falls within a predetermined percentage of the total airflow requirements of the equipment housed in the racks; and performing step (a) with the vent tiles set to the uniform level in response to the summed mass flow rates of air supplied through the vent tiles falling within the predetermined percentage of the total airflow requirements of the equipment housed in the racks.

14. The method according to claim 13, further comprising:

increasing the vent tile openings by a predefined amount in response to the summed mass flow rates of air supplied through the vent tiles falling below or equaling the predetermined percentage of the total airflow requirements of the equipment housed in the racks;

determining mass flow rates of air supplied through the vent tiles at the increased vent tile openings;

summing the mass flow rates of air supplied through the vent tiles;

determining whether the summed mass flow rates of air supplied through the vent tiles falls within a predetermined percentage of the total airflow requirements of the equipment housed in the racks; and performing step (a) with the vent tiles set at the increased openings in response to the summed mass flow rates of air supplied through the vent tiles falling within the predetermined percentage of the total airflow requirements of the equipment housed in the racks.

15. The method according to claim 13, further comprising:

decreasing the vent tile openings by a predefined amount in response to the summed mass flow rates of air supplied through the vent tiles exceeding the predetermined percentage of the total airflow requirements of the equipment housed in the racks.

determining mass flow rates of air supplied through the vent tiles at the decreased vent tile openings;

summing the mass flow rates of air supplied through the vent tiles;

determining whether the summed mass flow rates of air supplied through the vent tiles falls within a predetermined percentage of the total airflow requirements of the equipment housed in the racks; and performing step (a) with the vent tiles set at the decreased openings in response to the summed mass flow rates of air supplied through the vent tiles falling within the predetermined percentage of the total airflow requirements of the equipment housed in the racks.

16. The method according to claim 1, wherein the step of correlating the vent tiles and the racks further comprises approximating a correlation between at least one of the vent tiles and at least one of the racks based upon a distance between the at least one of the vent tiles and the at least one of the racks.

17. The method according to claim 1, further comprising:
identifying vent tiles whose influence over the racks is below a predefined threshold;
determining whether the number of identified vent tiles exceeds a predetermined threshold; and
at least one of deactivating and replacing the identified vent tiles in response to the number of identified vent tiles falling below the predetermined threshold.

18. The method according to claim 1, further comprising:
identifying vent tiles whose influence over the racks is below a predefined threshold;
determining whether the number of identified vent tiles exceeds a predetermined threshold; and
grouping the identified vent tiles into one or more groups according to their locations with respect to each other in response to the number of identified vent tiles falling below the predetermined threshold.

19. A computing device configured to evaluate relationships between vent tiles and racks, said computing device comprising:
an input module implemented by a first programming code stored on a computer readable medium configured to receive communications from one or more sensing devices;
a vent tile influence coefficient (VTI) calculation module implemented by a second programming code stored on the computer readable medium, wherein the VTI correlates a relationship between the mass flow rate of air supplied through the vent tiles and the mass flow rate of air delivered into the racks; and
a controller configured to execute the first programming code and the second programming code.

20. The computing device according to claim 19, wherein the VTI calculation module is further configured to solve the following matrix equation:

[VTI]=[$M_R$]·[$M_{VT}$]$^{-1}$, wherein VTI is a vent tile influence coefficient matrix, $M_R$ is the vector of mass flow rates of air delivered to each rack and $M_{VT}$ is the vector of mass flow rates of air through each vent tile.

21. The computing device according to claim 19, wherein the VTI calculation module is further configured to solve the following equation:

[$M_R \Delta T_R$]$_A$=[VTI]$_A$·[$\Delta M_{VT} T_{VT}$], wherein [$M_R \Delta T_R$]$_A$ is a 1×N matrix and represents a product of the mass flow rate and inlet temperature change for a single rack (A), [VTI]$_A$ is a 1×N matrix and is a vent tile index coefficient for rack A, and [$\Delta M_{VT} T_{VT}$]$_A$ is an N×M matrix and is a product of change in vent tile flow rates and temperatures of the airflow supplied by the vent tiles as the vent tile openings are varied sequentially N times.

22. The computing device according to claim 19, further comprising:
an index of re-circulation module implemented by a third programming code stored on a computer readable medium configured to calculate levels of re-circulation of heated airflow into cooled airflow delivered into the nicks from the vent tiles; and
wherein the controller is configured to execute the third programming code.

23. The computing device according to claim 22, wherein the VTI calculation module is further configured to solve the following matrix equation:

[$M_R$]=[VTI]·[$M_{VT}$]+[Γ], wherein VTI is a vent tile influence coefficient matrix, $M_R$ is a vector of mass flow rates of air delivered to each rack, $M_{VT}$ is a vector of mass flow rates of air through each vent tile, and Γ is a matrix of the re-circulation mass flow rate that infiltrates the inlets of the racks calculated by the index of re-circulation calculation module.

24. The computing device according to claim 22, wherein the VTI calculation module is further configured to solve the following equation:

[$M_R \Delta T_R$]$_A$=[VTI]$_A$·[$\Delta M_{VT} T_{TV}$]+[$\Delta \Gamma$]$_A$, wherein [$M_R \Delta T_R$]$_A$ is a 1×N matrix and represents a product of the mass flow rate and inlet temperature change for a single rack (A), [VTI]$_A$ is a 1×N matrix and is a vent tile index coefficient for rack A, [$\Delta M_{VT} T_{VT}$]$_A$ is an N×M matrix and is a product of change in vent tile flow rates and temperatures of the airflow supplied by the vent tiles as the vent tile openings are varied sequentially N times, and [$\Delta \Gamma$]$_A$ is the 1×N re-circulation matrix for rack A calculated by the index of re-circulation calculation module.

25. The computing device according to claim 22, wherein the VTI calculation module is further configured to solve the following equation:

$$\sum_k^m VTI_{j,k} M_k^{*vt} + \frac{SHI}{1-SHI} = 1,$$

wherein M denotes the mass flow rates of air, r denotes the racks, vt denotes the vent tiles, j denotes the jth rack, k denotes the kth vent tile, and m denotes the number of vent tiles, and wherein the index of re-circulation calculation module is configured to calculate SHI through the following equation:

$$SHI = \frac{\sum_j \sum_i ((T_{in}^r)_{i,j} - T_{ref})}{\sum_j \sum_i ((T_{out}^r)_{i,j} - T_{ref})},$$

wherein $(T^r_{in})_{i,j}$ and $(T^r_{out})_{i,j}$ are the respective inlet and outlet temperatures from the ith rack in the jth row of racks and $T_{ref}$ denotes the average temperature of the airflow supplied through the vent tiles.

26. The computing device according to claim 19, wherein the controller configured to control one or more functions of the computing device, wherein said controller is configured to determine whether values of the calculated VTI are near zero, and wherein the controller is further configured vary at least one of vent tile openings and CRAC unit outputs based upon a determination that values of the calculated VTI are near zero.

27. The computing device according to claim 19, wherein the controller configured to control one or more functions of the computing device, wherein said controller is configured to determine a total airflow requirement of equipment housed in the racks, determine the mass flow rates of air supplied through the vent tiles, sum the mass flow rates of air supplied through the vent tiles, determine whether the summed mass flow rates of air supplied through the vent tiles falls within a predetermined percentage of the total airflow requirements of the equipment, and vary the vent tile openings by a predefined amount in response to the summed mass flow rates of air supplied through the vent tiles falling outside the predetermined percentage of the total airflow requirements of the equipment.

28. The computing device according to claim 19, wherein the controller configured to group vent tiles that have relatively little influence over the racks into one or more groups, and wherein the controller is configured to control each of the one or more groups of vent tiles as individual vent tiles.

29. A computer readable storage medium on which is embedded one or more computer programs, said one or more computer programs implementing a method of correlating vent tiles with racks, said one or more computer programs comprising a set of instructions for:

determining mass flow rates of air received by the racks;
determining mass flow rates of air supplied through the vent tiles;
determining mass flow rates of air received by the racks with the one of the vent tiles closed;
determining mass flow rates of air supplied by the vent tiles with the one of the vent tiles closed; and
correlating the vent tiles and the racks based upon the determined mass flow rates of air received by the racks and the mass flow rates of air supplied through the vent tiles at a first iteration and a second iteration with the one of the vent tiles closed.

30. The computer readable storage medium according to claim 29, said one or more computer programs further comprising a set of instructions for:
solving the following matrix equation:
$[VTI]=[M_R]\cdot[M_{VT}]^{-1}$, wherein VTI is a vent tile influence coefficient matrix, $M_R$ is the vector of mass flow rates of air delivered to each rack and $M_{VT}$ is the vector of mass flow rates of air through each vent tile.

31. The computer readable storage medium according to claim 29, said one or more computer programs further comprising a set of instructions for:
solving the following matrix equation:
$[M_R]=[VTI]\cdot[M_{VT}]+[\Gamma]$, wherein VTI is a vent tile influence coefficient matrix, $M_R$ is a vector of mass flow rates of air delivered to each rack, $M_{VT}$ is a vector of mass flow rates of air through each vent tile, and $\Gamma$ is a matrix of the re-circulation mass flow rate that infiltrates inlets of the racks.

* * * * *

UNITED STATES PATENT AND TRADEMARK OFFICE
CERTIFICATE OF CORRECTION

PATENT NO. : 7,313,924 B2  Page 1 of 1
APPLICATION NO. : 10/960573
DATED : January 1, 2008
INVENTOR(S) : Cullen E. Bash et al.

It is certified that error appears in the above-identified patent and that said Letters Patent is hereby corrected as shown below:

In column 6, line 33, after "are" delete "a" and insert -- also --, therefor.

In column 6, line 54, after "assist" insert -- in --.

In column 12, line 61, delete "[10]" and insert -- [0] --, therefor.

In column 22, line 62, delete "solve" and insert -- solved to --, therefor.

In column 25, line 12, in Claim 8, delete "$[\Delta M_{VT} T_{TV}]_A$" and insert -- $[\Delta M_{VT} T_{VT}]_A$ --, therefor.

In column 27, line 2, in Claim 15, after "racks" delete "." and insert -- ; --, therefor.

In column 27, line 64, in Claim 21, delete "$[M_R \Delta T_{R]A}$" and insert -- $[M_R \Delta T_R]_A$ --, therefor.

In column 28, line 11, in Claim 22, delete "nicks" and insert -- racks --, therefor.

In column 28, line 27, in Claim 24, delete "$[\Delta M_{VT} T_{TV}]$" and insert -- $[\Delta M_{VT} T_{VT}]$ --, therefor.

Signed and Sealed this

Tenth Day of June, 2008

JON W. DUDAS
*Director of the United States Patent and Trademark Office*